(12) United States Patent
Nishijima

(10) Patent No.: US 8,754,693 B2
(45) Date of Patent: Jun. 17, 2014

(54) LATCH CIRCUIT AND SEMICONDUCTOR DEVICE

(71) Applicant: Semiconductor Energy Laboratory Co., Ltd., Atsugi (JP)

(72) Inventor: Tatsuji Nishijima, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/782,640

(22) Filed: Mar. 1, 2013

(65) Prior Publication Data
US 2013/0229218 A1  Sep. 5, 2013

(30) Foreign Application Priority Data

Mar. 5, 2012 (JP) .................... 2012-048118

(51) Int. Cl.
H03K 3/356 (2006.01)
H03K 3/012 (2006.01)
(52) U.S. Cl.
CPC .................... *H03K 3/012* (2013.01)
USPC ............................................. 327/208
(58) Field of Classification Search
CPC ........ H03K 3/012; H03K 3/037; H03K 3/281
USPC .......... 327/199–203, 208–212, 214, 215, 218
See application file for complete search history.

(56) References Cited

U.S. PATENT DOCUMENTS

| | | | |
|---|---|---|---|
| 4,656,607 A | 4/1987 | Hagiwara et al. |
| 4,809,225 A | 2/1989 | Dimmler et al. |
| 5,731,856 A | 3/1998 | Kim et al. |
| 5,744,864 A | 4/1998 | Cillessen et al. |
| 5,936,879 A | 8/1999 | Brouwer et al. |
| 6,127,702 A | 10/2000 | Yamazaki et al. |

(Continued)

FOREIGN PATENT DOCUMENTS

| | | |
|---|---|---|
| EP | 0 135 036 A2 | 3/1985 |
| EP | 0 297 777 A2 | 1/1989 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Sibin Chen
(74) *Attorney, Agent, or Firm* — Fish & Richardson P.C.

(57) ABSTRACT

A nonvolatile latch circuit is provided. In the latch circuit, a transistor in which a channel region is formed with an oxide semiconductor, which is a wide band gap semiconductor, is included, and data is stored in a node formed by one terminal of a capacitor and one of a source and a drain of the transistor, and is brought into a floating state when the transistor is turned off. After that, even when charge stored in the node is insufficient at time of restoring the data, charge is supplied by feedback; therefore, time necessary for restoring the data can be shortened and even when the power supply is restarted in the state of storing data, the data can be restored at high speed.

22 Claims, 20 Drawing Sheets

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,576,943 B1 | 6/2003 | Ishii et al. |
| 6,727,522 B1 | 4/2004 | Kawasaki et al. |
| 6,738,281 B2 | 5/2004 | Yokozeki |
| 6,788,567 B2 | 9/2004 | Fujimori |
| 6,809,952 B2 | 10/2004 | Masui |
| 6,845,032 B2 | 1/2005 | Toyoda et al. |
| 6,876,023 B2 | 4/2005 | Ishii et al. |
| 6,944,045 B2 | 9/2005 | Fujimori |
| 6,972,986 B2 | 12/2005 | Peng et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,064,973 B2 | 6/2006 | Peng et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,616,040 B2 | 11/2009 | Motomura |
| 7,674,650 B2 | 3/2010 | Akimoto et al. |
| 7,732,819 B2 | 6/2010 | Akimoto et al. |
| 7,847,287 B2 | 12/2010 | Kim et al. |
| 7,863,611 B2 | 1/2011 | Abe et al. |
| 7,940,085 B2 | 5/2011 | Kim et al. |
| 8,085,076 B2 | 12/2011 | Djaja et al. |
| 8,158,987 B2 | 4/2012 | Nabekura et al. |
| 8,217,680 B2 | 7/2012 | Kim et al. |
| 8,314,637 B2 | 11/2012 | Kato et al. |
| 8,362,538 B2 | 1/2013 | Koyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0071039 A1 | 4/2004 | Fujimori |
| 2004/0127038 A1 | 7/2004 | Carcia et al. |
| 2004/0164778 A1 | 8/2004 | Toyoda et al. |
| 2005/0017302 A1 | 1/2005 | Hoffman |
| 2005/0169039 A1 | 8/2005 | Peng et al. |
| 2005/0169040 A1 | 8/2005 | Peng et al. |
| 2005/0199959 A1 | 9/2005 | Chiang et al. |
| 2005/0205921 A1 | 9/2005 | Ishii et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0019460 A1 | 1/2007 | Kang et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0126666 A1 | 6/2007 | Yamazaki et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0170028 A1 | 7/2008 | Yoshida |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258789 A1 | 10/2008 | Motomura |
| 2008/0296568 A1 | 12/2008 | Ryu et al. |
| 2009/0002044 A1 | 1/2009 | Kobayashi |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206891 A1* | 8/2009 | Guimont ................. 327/143 |
| 2009/0278122 A1 | 11/2009 | Hosono et al. |
| 2009/0280600 A1 | 11/2009 | Hosono et al. |
| 2010/0019839 A1 | 1/2010 | Monden |
| 2010/0065844 A1 | 3/2010 | Tokunaga |
| 2010/0085081 A1 | 4/2010 | Ofuji et al. |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2011/0010493 A1 | 1/2011 | Kimura et al. |
| 2011/0024741 A1 | 2/2011 | Abe et al. |
| 2011/0089417 A1 | 4/2011 | Yamazaki et al. |
| 2011/0101351 A1 | 5/2011 | Yamazaki |
| 2011/0121878 A1 | 5/2011 | Kato et al. |
| 2011/0148463 A1 | 6/2011 | Kato et al. |
| 2011/0156024 A1 | 6/2011 | Koyama et al. |
| 2011/0176357 A1 | 7/2011 | Koyama et al. |
| 2011/0187410 A1 | 8/2011 | Kato et al. |
| 2012/0112257 A1 | 5/2012 | Kato |
| 2012/0250397 A1 | 10/2012 | Ohmaru |
| 2012/0286260 A1 | 11/2012 | Noda et al. |

FOREIGN PATENT DOCUMENTS

| | | |
|---|---|---|
| EP | 0 530 928 A2 | 3/1993 |
| EP | 0 818 891 A2 | 1/1998 |
| EP | 1 447 909 A1 | 8/2004 |
| EP | 1 583 239 A2 | 10/2005 |
| EP | 1 737 044 A1 | 12/2006 |
| EP | 2 226 847 A2 | 9/2010 |
| JP | 60-025269 A | 2/1985 |
| JP | 60-198861 A | 10/1985 |
| JP | 62-177794 A | 8/1987 |
| JP | 63-210022 A | 8/1988 |

(56) References Cited

FOREIGN PATENT DOCUMENTS

| | | | |
|---|---|---|---|
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 64-066899 A | 3/1989 | |
| JP | 03-192915 A | 8/1991 | |
| JP | 05-110392 A | 4/1993 | |
| JP | 05-251705 A | 9/1993 | |
| JP | 07-147530 A | 6/1995 | |
| JP | 08-264794 A | 10/1996 | |
| JP | 10-093423 A | 4/1998 | |
| JP | 11-505377 A | 5/1999 | |
| JP | 2000-044236 A | 2/2000 | |
| JP | 2000-077982 A | 3/2000 | |
| JP | 2000-150900 A | 5/2000 | |
| JP | 2000-269457 A | 9/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-212477 A | 7/2004 | |
| JP | 2004-273614 A | 9/2004 | |
| JP | 2004-273732 A | 9/2004 | |
| JP | 2005-269616 A | 9/2005 | |
| JP | 2005-323295 A | 11/2005 | |
| JP | 2006-050208 A | 2/2006 | |
| JP | 2006-165532 A | 6/2006 | |
| JP | 2007-096055 A | 4/2007 | |
| JP | 2007-123861 A | 5/2007 | |
| JP | 2007-125823 A | 5/2007 | |
| JP | 2007-179021 A | 7/2007 | |
| JP | 2008-147903 A | 6/2008 | |
| JP | 2007-125823 A | 9/2009 | |
| JP | 2009-206942 A | 9/2009 | |
| JP | 2009-212443 A | 9/2009 | |
| JP | 2010-034710 A | 2/2010 | |
| WO | 03/044953 A1 | 5/2003 | |
| WO | 2004/059838 A1 | 7/2004 | |
| WO | 2004/114391 A1 | 12/2004 | |
| WO | 2009/110623 A1 | 9/2009 | |

OTHER PUBLICATIONS

Orita, M et al., "Amorphous transparent conductive oxide InGaO3(ZnO)m (M<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-effect Transistor on SrTiO3 with sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al. "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A) May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

(56) References Cited

OTHER PUBLICATIONS

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WSGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202.-6.

Oh, M et al., "Improving the Gate Stability of ZnO Thin-Film Transistors With Aluminum Oxide Dielectric Layers," J. Electrochem. Soc. (Journal of The Electrochemical Society), 2008, vol. 155, No. 12, pp. H1009-H1014.

Ohara, H et al., "21.3: 4.0 in. QVGA AMOLED Display Using In—Ga—Zn—Oxide TFTS With a Novel Passivation Layer," SID Digest '09 : SID International Symposium Digest of Technical Papers, May 31, 2009, pp. 284-287.

(56) References Cited

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931.

* cited by examiner

LATCH CIRCUIT AND SEMICONDUCTOR DEVICE

BACKGROUND OF THE INVENTION

1. Field of the Invention

The present invention relates to a latch circuit and a semiconductor device.

The present invention relates to a latch circuit and a semiconductor device including the latch circuit. Note that the semiconductor device in this specification indicates all the devices that operate by utilizing semiconductor characteristics.

2. Description of the Related Art

A latch circuit is a circuit that can temporarily hold a specific logic state (hereinafter also referred to as data), and is used in a variety of semiconductor devices. For example, a latch circuit is used as a circuit that temporarily holds data when the data is written or read to/from a storage circuit provided in a semiconductor device.

The latch circuit can be constituted by logic gates. For example, a D latch circuit illustrated in FIG. 13 is known.

In the latch circuit constituted by logic gates as illustrated in FIG. 13, stored data is lost when power supply is stopped. In addition, a large number of semiconductor elements (such as transistors) are required to form the latch circuit.

Further, a latch circuit can be constituted by a non-volatile ferroelectric element (see Patent Document 1). In that case, data can be held in the ferroelectric element even when power supply is stopped. However, when the ferroelectric element is used, deterioration of data retention characteristics due to the increase in the number of rewrite operations tends to be obvious.

REFERENCE

Patent Document

[Patent Document 1] Japanese Published Patent Application No. 2004-212477

SUMMARY OF THE INVENTION

In view of the above, an object of one embodiment of the present invention is to provide a non-volatile latch circuit. Specifically, an object of one embodiment of the present invention is to provide a latch circuit in which data does not deteriorate and can be stored even when power supply is stopped.

Further, one object of one embodiment of the present invention is to reduce power consumption compared to a conventional latch circuit.

Note that one embodiment of the present invention aims to achieve at least one of the above objects.

In one embodiment of the present invention, a transistor is formed using a material which can sufficiently reduce off-state current, for example, an oxide semiconductor material which is a wide band gap semiconductor. Using the wide band gap semiconductor material capable of achieving a sufficiently low off-state current of a transistor makes it possible to hold a potential for a long time without regular or constant supply of power, and therefore, low power consumption can be achieved.

Specifically, one embodiment of the present invention is a latch circuit including a first input terminal, a first switch to which a signal from the first input terminal is inputted, a first inverter which is electrically connected to the first switch and to which an output of the first input terminal is inputted, an output terminal, a recovery switch, a diode, a first transistor, a second transistor, a second inverter, a second switch which is electrically connected to the first inverter and to which an output of the second inverter is inputted, a capacitor electrically connected to one of a source and a drain of the first transistor, a second input terminal electrically connected to a gate of the first transistor, and a third input terminal electrically connected to a gate of the second transistor. A signal from the first inverter is inputted to the output terminal, the recovery switch, and the diode. The first transistor, the second transistor, and the second inverter are electrically connected to the recovery switch and the diode. The recovery switch is connected to the diode in parallel and the first transistor is a transistor in which off-state current per channel width is lower than or equal to $1\times10^{-19}$ A/μm.

Further, another embodiment of the present invention is a latch circuit including a first input terminal, a first switch to which a signal from the first input terminal is inputted, a first inverter which is electrically connected to the first switch and to which an output of the first input terminal is inputted, an output terminal, a transmission gate, a diode, a first transistor, a second transistor, a second inverter, a second switch which is electrically connected to the first inverter and to which an output of the second inverter is inputted, a capacitor electrically connected to one of a source and a drain of the first transistor, a second input terminal electrically connected to a gate of the first transistor, and a third input terminal electrically connected to a gate of the second transistor. A signal from the first inverter is inputted to the output terminal, the transmission gate, and the diode. The first transistor, the second transistor, and the second inverter are electrically connected to the transmission gate and the diode. The transmission gate is connected to the diode in parallel and the first transistor is a transistor in which off-state current per channel width is lower than or equal to $1\times10^{-19}$ A/μm.

Further, in the above configurations, a diode-connected transistor is preferably used as the diode.

Further, in the above configurations, the first transistor in which the off-state current per channel width is lower than or equal to $1\times10^{-19}$ A/μm is preferably a transistor in which an oxide semiconductor is used for a channel region.

Another embodiment of the present invention is a semiconductor device including any of the above latch circuits. For example, a D flip-flop and the like are given.

In the latch circuit in one embodiment of the present invention, data is stored in a node which is electrically connected to one of the source and the drain of the transistor in which the off-state current per channel width is lower than or equal to $1\times10^{-19}$ A/μm (e.g., a transistor in which a channel region is formed with the oxide semiconductor which is the wide band gap semiconductor) and is brought into a floating state when the transistor is turned off. Note that the off-state current (leakage current) of the transistor is extremely low. Therefore, when the potential of the node is set to a specific value and then the transistor is turned off, the potential can be kept constant or almost constant. Consequently, data can be accurately stored in the latch circuit. Furthermore, the transistor is kept off even when supply of power to the latch circuit is stopped. As a result, data does not deteriorate and can be stored in the latch circuit even when power supply is stopped.

Further, in the latch circuit in one embodiment of the present invention, the flow of a large amount of flow-through current to the inverters can be suppressed and power consumption can be reduced.

DETAILED DESCRIPTION OF THE INVENTION

Figure 1:
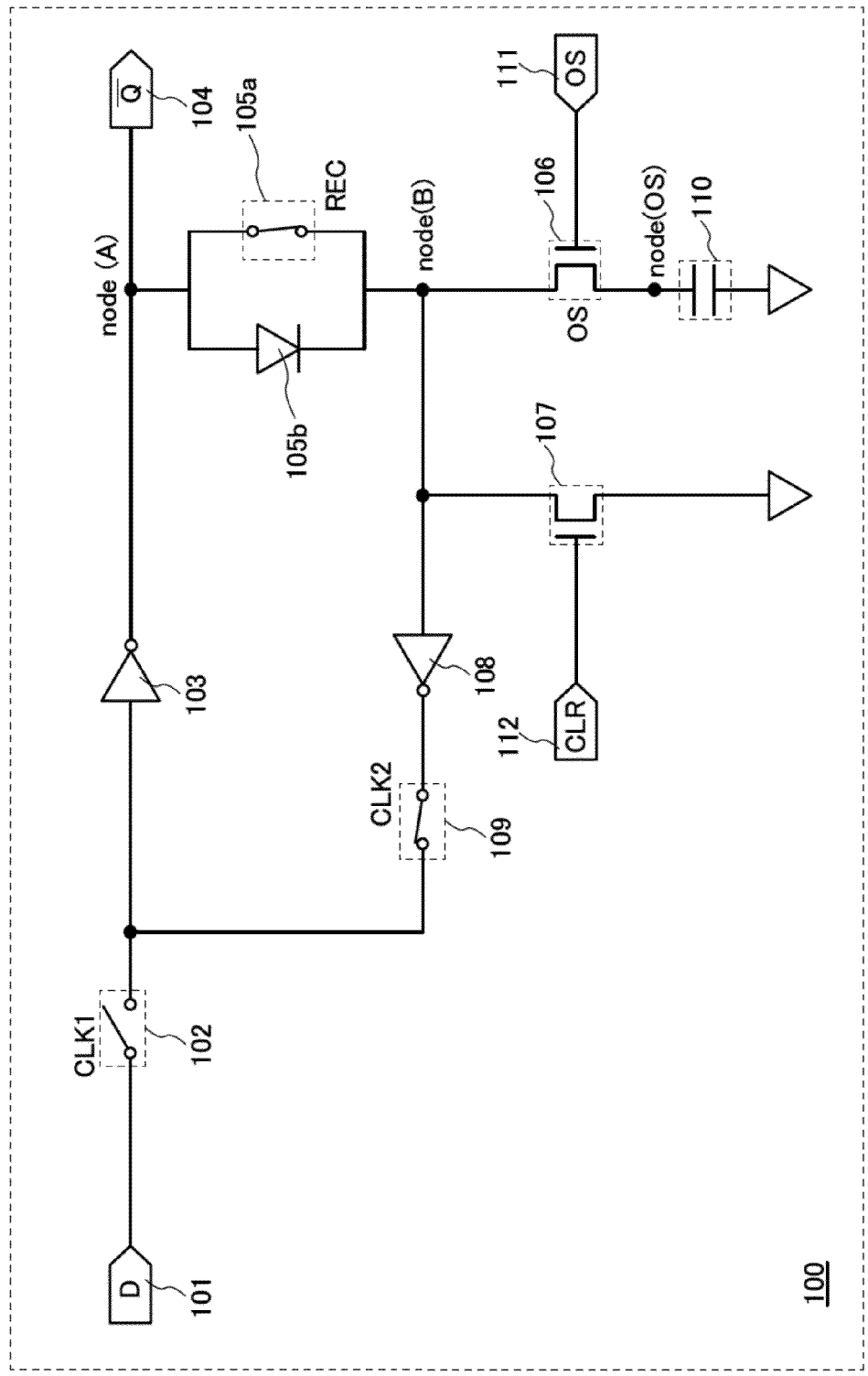
FIG. 1 is a diagram illustrating a latch circuit according to one embodiment of the present invention.

Embodiments of the present invention will be described below with reference to the accompanying drawings. Note that the present invention is not limited to the description below, and it is easily understood by those skilled in the art that a variety of changes and modifications can be made without departing from the spirit and scope of the present invention. Accordingly, the invention should not be construed as being limited to the description of the embodiments below.

Note that functions of the "source" and "drain" may be switched in the case where transistors of different polarities are employed or in the case where the direction of a current flow changes in a circuit operation, for example. Therefore, the terms "source" and "drain" can be used to denote the drain and the source, respectively, in this specification.

The term "electrically connected" includes the case where components are connected through an "object having any electric function". There is no particular limitation on the "object having any electric function" as long as electric signals can be transmitted and received between the components connected through the object.

The position, size, range, or the like of each component illustrated in drawings and the like is not accurately represented in some cases for easy understanding. Therefore, the disclosed invention is not necessarily limited to the position, size, range, or the like as disclosed in the drawings and the like.

Ordinal numbers such as "first", "second", and "third" are used in order to avoid confusion among components.

Embodiment 1

In this embodiment, a latch circuit of an embodiment of the present invention is described with reference to FIG. 1, FIGS. 2A and 2B, FIGS. 3A and 3B, FIGS. 4A and 4B, FIG. 5, and FIG. 6.

<Example of Circuit Configuration>

First, a circuit configuration of a latch circuit 100 in this embodiment is described with reference to FIG. 1. FIG. 1 shows a nonvolatile D latch circuit.

The latch circuit 100 illustrated in FIG. 1 includes an input terminal 101, a switch 102 to which a signal from the input terminal 101 is inputted, an inverter 103 which is electrically connected to the switch 102 and to which an output of the input terminal 101 is inputted, an output terminal 104, a recovery switch 105a, and a diode 105b, to which an output signal of the inverter 103 is inputted, a transistor 106, a transistor 107, and an inverter 108, electrically connected to the recovery switch 105a and a cathode of the diode 105b, a switch 109 where is electrically connected to the inverter 103 and to which an output of the inverter 108 is inputted, a capacitor 110 electrically connected to one of a source and a drain of the transistor 106, an input terminal 111 electrically connected to a gate of the transistor 106, and an input terminal 112 electrically connected to a gate of the transistor 107.

An on state and an off state of the switch 102, the recovery switch 105a, and the switch 109 are respectively changed by a clock signal inputted from CLK1, REC, and CLK2 (also referred to as a clock signal CLK1, a clock signal REC, and a clock signal CLK2). Further, CLK1 and CLK2 have an inverted relationship; thus, when the switch 102 is on, the switch 109 is off, and when the switch 102 is off, the switch 109 is on. At this time, it is preferable that, first, a switch which is on be turned off; then, a switch which is off be turned on. In this manner, a signal can be appropriately sent without mixing.

Each of the switch 102, the recovery switch 105a, and the switch 109 is formed with one or more circuit selected from an AND circuit, a NAND circuit, an OR circuit, and a NOR circuit.

Figure 14:
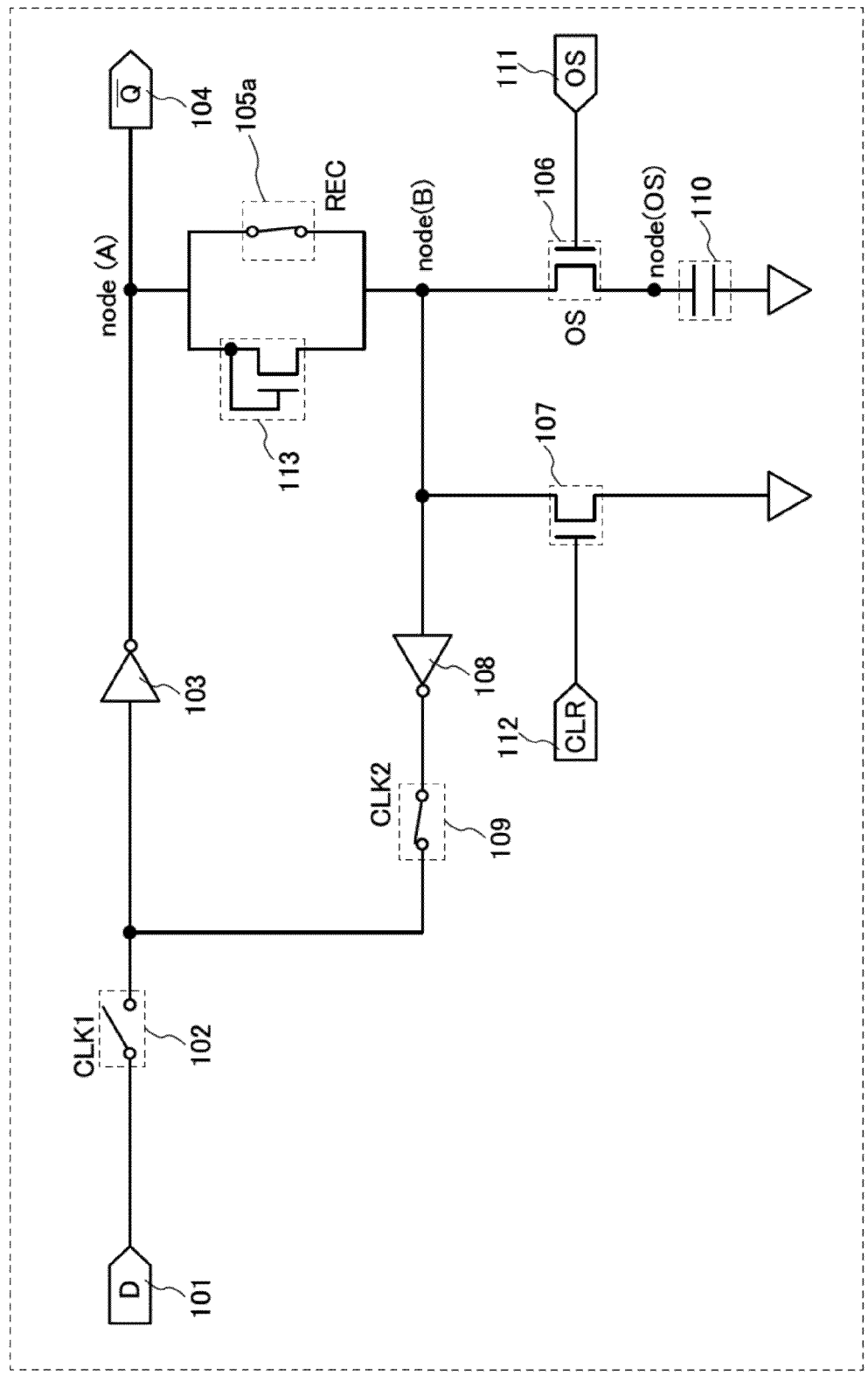
FIG. 14 is a diagram illustrating a latch circuit according to one embodiment of the present invention.

Further, as the diode 105b, a diode-connected transistor 113 may be used as illustrated in FIG. 14. The diode-connected transistor 113 can be manufactured in the same process as another transistor (e.g., the transistor 107); therefore, the manufacturing process can be simplified.

Note that a node which is formed by connection of the inverter 103, the output terminal 104, the recovery switch 105a, and the diode 105b is referred to as a node (A). Further, a node which is formed by connection of the recovery switch 105a, the diode 105b, the other of the source and the drain of the transistor 106, one of a source and a drain of the transistor 107, and the inverter 108 is referred to as a node (B). In addition, a node which is formed by connection of the one of the source and the drain of the transistor 106 and one terminal of the capacitor 110 is referred to as a node (OS).

Further, as the transistor 106, a transistor in which the off-state current (leakage current) per channel width is lower than or equal to $1\times10^{-19}$ A/μm, for example, a transistor in which an oxide semiconductor, a wide band gap semiconductor, is included in a channel region can be used. Note that for the transistor in which the off-state current per channel width is lower than or equal to $1\times10^{-19}$ A/μm, a semiconductor material which has a band gap larger than silicon can also be used. A semiconductor material having a band gap greater than or equal to 2 eV, preferably greater than or equal to 2.5 eV, more preferably greater than or equal to 3 eV may be used.

Further, as the transistor 107, there is no limitation on types of transistor which can be used; for example, a single crystal semiconductor material or a polycrystalline semiconductor material made of silicon, silicon carbide, or the like, or a compound semiconductor material of silicon germanium, gallium arsenide, indium phosphide, or the like can be used. Note that it is preferable that a single crystal semiconductor material of silicon or the like be used because the operation speed of the transistor 107 can be improved.

Data is stored in the node (OS) which is electrically connected to one of the source and the drain of the transistor 106 comprising a channel region formed with the oxide semiconductor, the wide band gap semiconductor, and which is brought into a floating state when the transistor is turned off. Note that the off-state current (leakage current) of the transistor is extremely low. Therefore, when the potential of the node (OS) is set to a specific value and then the transistor is turned off, the potential can be kept constant or almost constant. Consequently, data can be accurately stored in the latch circuit.

Further, the energy gap of an oxide semiconductor is greater than or equal to 3.0 eV, which is much larger than the band gap of silicon (1.1 eV).

The off-resistance of the transistor (resistance between source and drain when the transistor is in an off state) is inversely proportional to the concentration of carriers thermally excited in a channel formation region of the semiconductor film. Since the band gap of silicon is 1.1 eV even in a state where there is no carrier caused by a donor or an acceptor (i.e., even in the case of an intrinsic semiconductor), the concentration of thermally excited carriers at room temperature (300 K) is approximately $1\times10^{11}$ cm$^{-3}$.

On the other hand, in the case of a semiconductor whose band gap is 3.2 eV (an oxide semiconductor, here), the concentration of thermally excited carriers is approximately $1\times10^{-7}$ cm$^{-3}$. When the electron mobility is the same, the resistivity is inversely proportional to the carrier concentration; thus, the resistivity of the semiconductor whose band gap is 3.2 eV is 18 orders of magnitude higher than that of silicon.

Here, in order to describe an "extremely low off-state current" of the transistor whose channel region is formed with the oxide semiconductor which is the wide band gap semiconductor, measurement results of the off-state current of a transistor including a highly purified oxide semiconductor are described below.

<Measurement of Off-State Current of Transistor Using Oxide Semiconductor>

Figure 15:
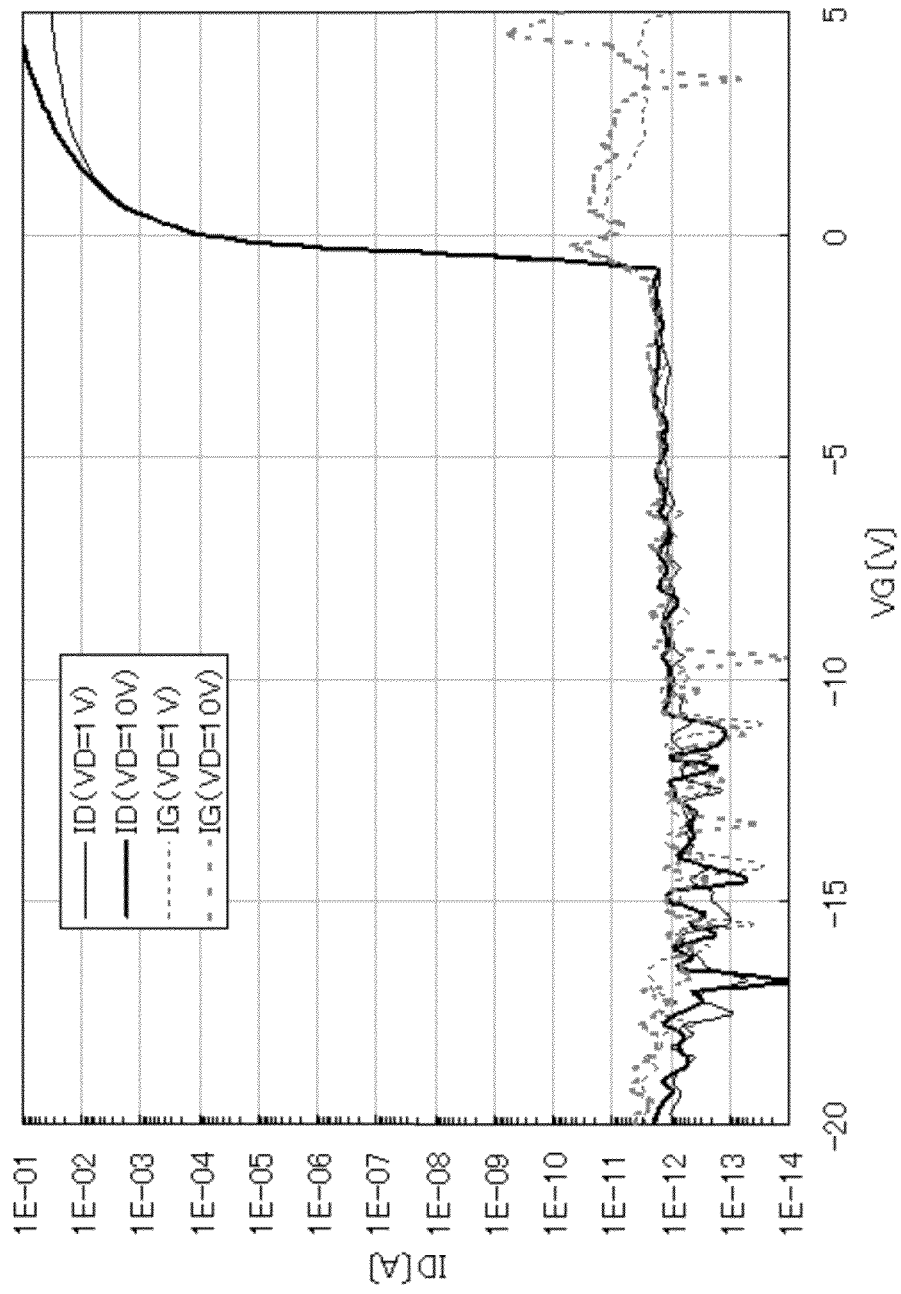
FIG. 15 is a graph showing characteristics of a transistor including an oxide semiconductor.

First, a transistor with a channel width W of 1 m, which is sufficiently wide, was prepared in consideration of the very small off current of a transistor including a highly purified oxide semiconductor, and the off current was measured. FIG. 15 shows the results obtained by measurement of the off-state current of the transistor with a channel width W of 1 m. In FIG. 15, the horizontal axis shows gate voltage $V_G$ and the vertical axis shows drain current $I_D$. In the case where the drain voltage $V_D$ is +1 V or +10 V and the gate voltage $V_G$ is in a range of −5 V to −20 V, the off-state current of the transistor is found to be lower than or equal to $1\times10^{-12}$ A which is the detection limit of the measurement equipment. Moreover, it is found that the off current of the transistor (per unit channel width (1 μm)) is smaller than or equal to 1 aA ($1\times10^{-18}$ A).

Next, the results obtained by more accurately measuring the off-state current of the transistor including a highly purified oxide semiconductor will be described. As described above, the off-state current of the transistor including a highly purified oxide semiconductor is found to be lower than or equal to $1\times10^{-12}$ A which is the detection limit of the measurement equipment. Here, the results obtained measuring more accurate off current (the value smaller than or equal to the detection limit of measurement equipment in the above measurement), with the use of an element for characteristic evaluation, will be described.

First, the element for characteristic evaluation which was used in a method for measuring current will be described with reference to FIG. 16.

Figure 16:
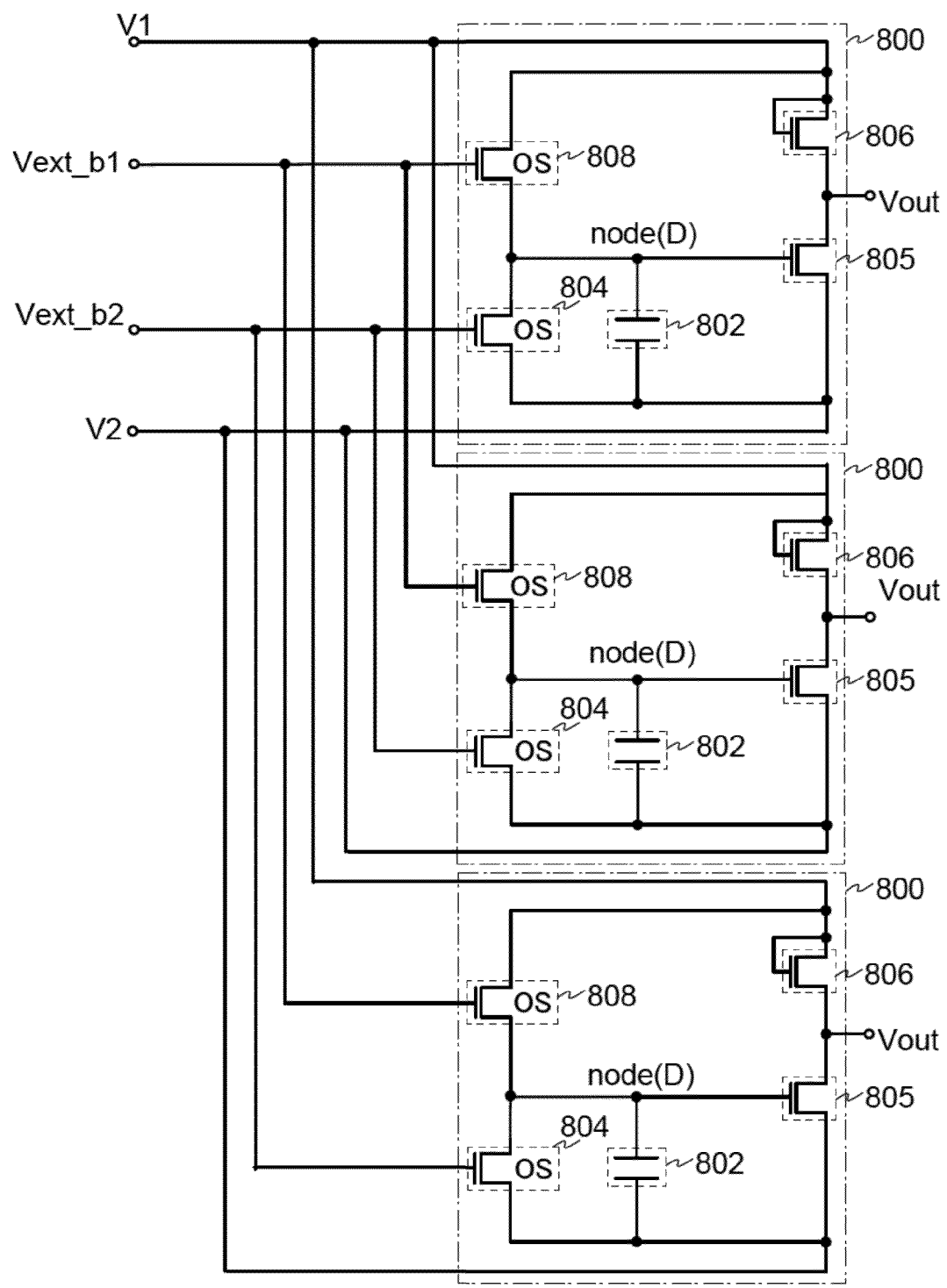
FIG. 16 is a circuit diagram for evaluating characteristics of the transistor including the oxide semiconductor.

In the element for characteristic evaluation in FIG. 16, three measurement systems 800 are connected in parallel. The measurement system 800 includes a capacitor 802, a transistor 804, a transistor 805, a transistor 806, and a transistor 808. As the transistor 804, the transistor 805, the transistor 806, and the transistor 808, transistors including a highly purified oxide semiconductor are employed.

In the measurement system 800, one of a source terminal and a drain terminal of the transistor 804, one of terminals of the capacitor 802, and one of a source terminal and a drain terminal of the transistor 805 are electrically connected to a power source (for supplying $V_2$). The other of the source terminal and the drain terminal of the transistor 804, one of a source terminal and a drain terminal of the transistor 808, the other of the terminals of the capacitor 802, and a gate terminal of the transistor 805 are electrically connected to one another. The other of the source terminal and the drain terminal of the transistor 808, one of a source terminal and a drain terminal of the transistor 806, and a gate terminal of the transistor 806 are electrically connected to a power source (for supplying $V_1$). The other of the source terminal and the drain terminal of the transistor 805 and the other of the source terminal and the drain terminal of the transistor 806 are electrically connected to each other and electrically connected to an output terminal.

A potential $V_{ext\_b2}$ for controlling an on state and an off state of the transistor 804 is supplied to the gate terminal of the transistor 804. A potential $V_{ext\_b1}$ for controlling an on state and an off state of the transistor 808 is supplied to the gate terminal of the transistor 808. A potential $V_{out}$ is output from the output terminal.

Next, a method for measuring current with the use of the element for characteristic evaluation will be described.

First, an initial period in which a potential difference is applied to measure the off current will be described briefly. In the initial period, the potential $V_{ext\_b1}$ for turning on the transistor 808 is input into the gate terminal of the transistor 808. Accordingly, a potential $V_1$ is supplied to a node (D) that is electrically connected to the other of the source terminal and the drain terminal of the transistor 804 (that is, the node electrically connected to one of the source terminal and the drain terminal of the transistor 808, the other of the terminals of the capacitor 802, and the gate terminal of the transistor 805). Here, the potential $V_1$ is, for example, a high potential. The transistor 804 is off.

After that, the potential $V_{ext\_b1}$ for turning on the transistor 808 is input into the gate terminal of the transistor 808 so that the transistor 808 is turned on. After the transistor 808 is turned off, the potential $V_1$ is set to low. Still, the transistor 804 is off. The potential $V_2$ is the same potential as $V_1$. Thus, the initial period is completed. In a state where the initial period is completed, a potential difference is generated between the node (D) and the one of the source terminal and the drain terminal of the transistor 804, and also, a potential difference is generated between the node (D) and the other of the source terminal and the drain terminal of the transistor 808. Thus, charge flows slightly through the transistor 804 and the transistor 808. That is, the off-state current flows.

Next, a measurement period of the off-state current is briefly described. In the measurement period, the potential (that is, $V_2$) of one of the source terminal and the drain terminal of the transistor 804 and the potential (that is, $V_1$) of the other of the source terminal and the drain terminal of the transistor 808 are set to low and fixed. On the other hand, the potential of the node (D) is not fixed (the node (D) is in a floating state) in the measurement period. Accordingly, electric charge flows through the transistor 804, and the amount of electric charge stored in the node (D) changes as time passes. The potential of the node (D) is changed depending on the change in the amount of electric charge stored in the node (D). That is to say, the output potential $V_{out}$ of the output terminal also varies.

Figure 17:
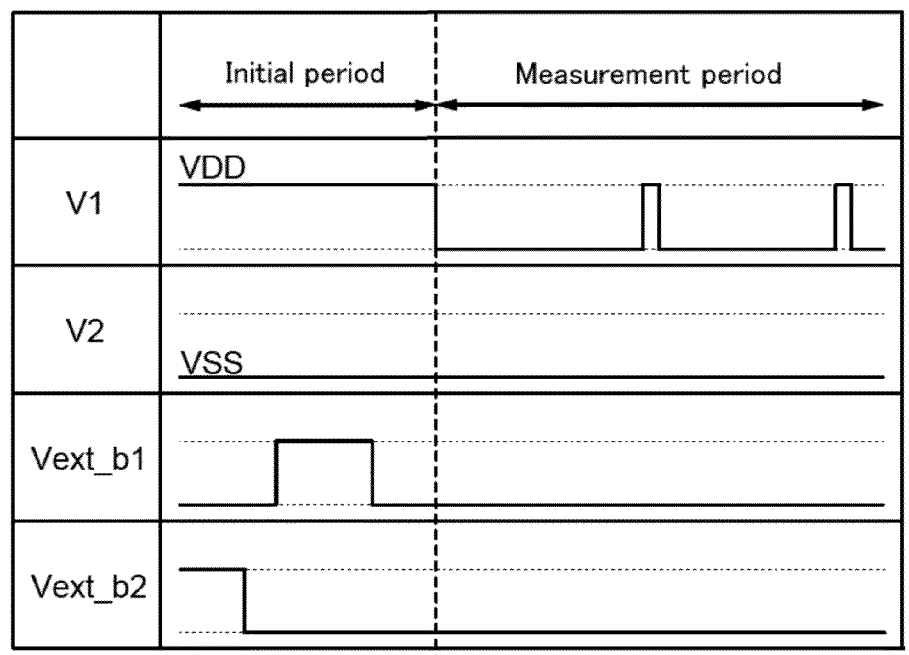
FIG. 17 is a timing chart for evaluating the characteristics of the transistor including the oxide semiconductor.

FIG. 17 shows details (a timing chart) of the relationship among potentials in the initial period in which the potential difference is generated and those in the subsequent measurement period.

In the initial period, first, the potential $V_{ext\_b2}$ is set to a potential (high potential) at which the transistor 804 is turned on. Thus, the potential of the node (D) comes to be $V_2$, that is, a low potential ($V_{SS}$). Note that a low potential ($V_{SS}$) is not necessarily supplied to the node (D). After that, the potential $V_{ext\_b2}$ is set to a potential (low potential) at which the transistor 804 is turned off, whereby the transistor 804 is turned off. Next, the potential $V_{ext\_b1}$ is set to a potential (a high potential) with which the transistor 808 is turned on. Thus, the potential of the node (D) comes to be $V_1$, that is, a high potential ($V_{DD}$). After that, the potential $V_{ext\_b1}$ is set to a potential at which the transistor 808 is turned off. Accordingly, the node (D) is brought into a floating state and the initial period is completed.

In the following measurement period, the potential $V_1$ and the potential $V_2$ are individually set to potentials at which electric charge flows to or from the node (D). Here, the potential $V_1$ and the potential $V_2$ are low potentials ($V_{SS}$). Note that at the timing of measuring the output potential $V_{out}$, it is necessary to operate an output circuit; thus, $V_1$ is set to a high potential ($V_{DD}$) temporarily in some cases. The period in which $V_1$ is a high potential ($V_{DD}$) is set to be short so that the measurement is not influenced.

When the potential difference is generated and the measurement period is started as described above, the amount of electric charge stored in the node (D) is changed as time passes, which changes the potential of the node (D). This means that the potential of a gate terminal of the transistor 805 varies and thus, the output potential $V_{out}$ of the output terminal also varies with the lapse of time.

A method for calculating the off-state current on the basis of the obtained output potential $V_{out}$ is described below.

The relation between the potential $V_D$ of the node (D) and the output potential $V_{out}$ is obtained in advance before the off current is calculated. With this, the potential $V_D$ of the node (D) can be obtained using the output potential $V_{out}$. In accordance with the above relationship, the potential $V_D$ of the node (D) can be expressed as a function of the output potential $V_{out}$ by the following Formula.

$$V_D = F(Vout) \qquad \text{[FORMULA 1]}$$

Electric charge $Q_D$ of the node (D) can be expressed by the following equation with the use of the potential $V_D$ of the node (D), capacitance $C_D$ of the capacitor connected to the node (D), and a constant (const). Here, the capacitance $C_D$ of the capacitor connected to the node (D) is the sum of the capacitance of the capacitor 802 and other capacitances.

$$Q_D = C_D V_D + \text{const} \qquad \text{[FORMULA 2]}$$

Since current $I_D$ of the node (D) is the time derivative of charge flowing to the node (D) (or charge flowing from the node (D)), the current $I_D$ of the node (D) is expressed by the following equation.

$$I_D = \frac{\Delta Q_D}{\Delta t} = \frac{C_D \, \Delta F(Vout)}{\Delta t} \qquad \text{[FORMULA 3]}$$

In this manner, the current $I_D$ of the node (D) can be obtained from the capacitance $C_D$ of the capacitor connected to the node (D) and the output potential Vout of the output terminal.

In accordance with the above method, it is possible to measure leakage current (off-state current) which flows between a source and a drain of a transistor in an off state.

In this embodiment, the transistor 804, the transistor 805, the transistor 806, and the transistor 808 each of which has a channel length L of 10 µm and a channel width W of 50 µm were manufactured using a highly purified oxide semiconductor. In the measurement systems 800 which are arranged in parallel, the capacitances of the capacitors 802 were 100 fF, 1 pF, and 3 pF.

Note that in the measurement of this embodiment, $V_{DD}$ was 5 V and $V_{SS}$ was 0 V. In the measurement period, $V_{out}$ was measured while the potential $V_1$ was basically set to $V_{SS}$ and changed to $V_{DD}$ for 100 msec at intervals of 10 sec to 300 sec. Further, $\Delta t$ which was used in calculation of current I which flows through the element was about 30000 sec.

Figure 18:
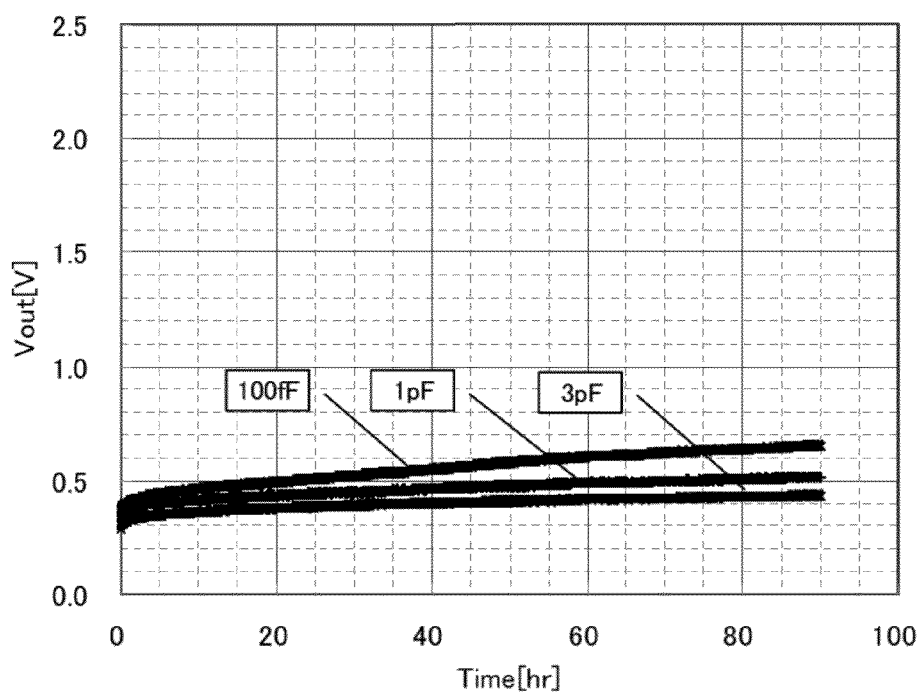
FIG. 18 is a graph showing characteristics of the transistor including the oxide semiconductor.

FIG. 18 shows the relation between the output potential $V_{out}$ and elapsed time Time in the current measurement. As is seen in FIG. 18, the potential changes over time.

Figure 19:
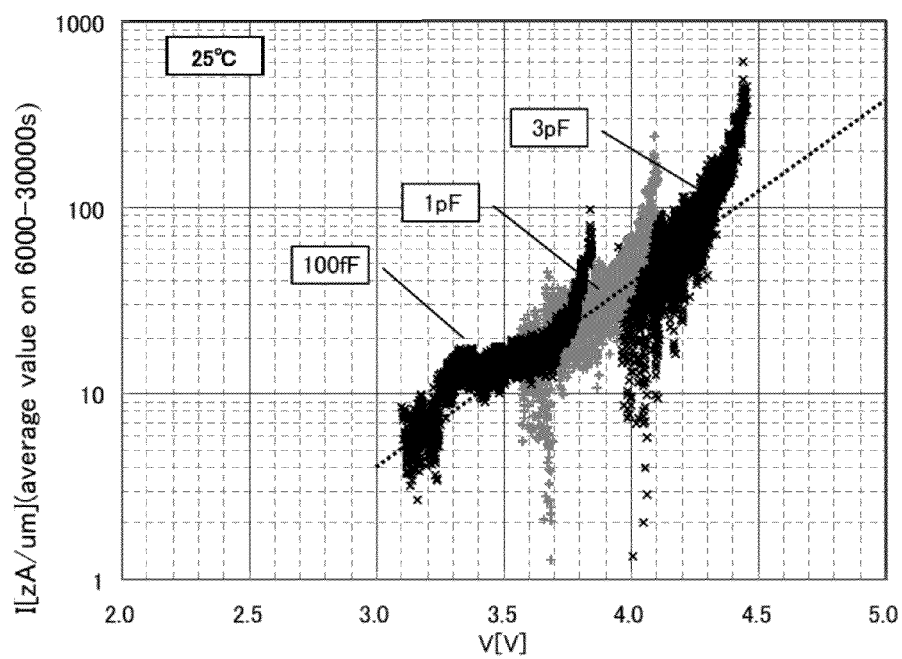
FIG. 19 is a graph showing characteristics of the transistor including the oxide semiconductor.

FIG. 19 shows the off-state current at room temperature (25° C.) calculated in the above current measurement. Note that FIG. 19 shows the relation between source-drain voltage V and off-state current I. According to FIG. 19, the off-state current is approximately 40 zA/µm (that is, $4 \times 10^{-20}$ A/µm) under the condition that the source-drain voltage is 4 V. In addition, the off-state current is less than or equal to 10 zA/µm (less than or equal to $1 \times 10^{-20}$ A/µm) under the condition where the source-drain voltage is 3.1 V.

Figure 20:
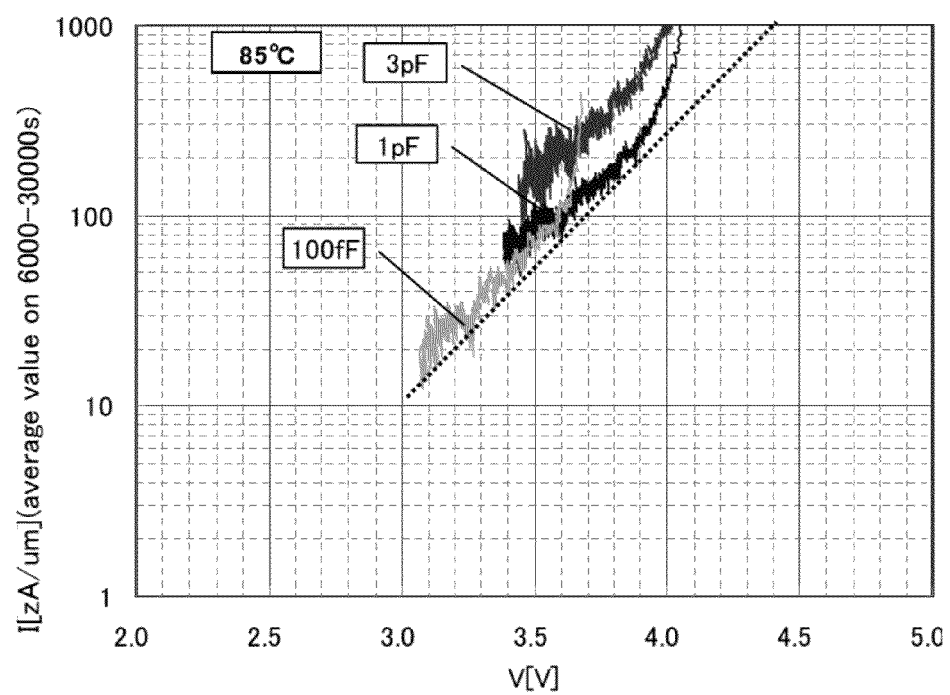
FIG. 20 is a graph showing characteristics of the transistor including the oxide semiconductor.

Further, FIG. 20 shows the off-state current at the time when the temperature is 85° C. calculated in the above current measurement. FIG. 20 shows the relation between the source-drain voltage V and the off-state current I at the time when the temperature is 85° C. According to FIG. 20, the off-state current is less than or equal to 100 zA/µm (less than or equal to $1 \times 10^{-19}$ A/µm) when the source-drain voltage is 3.1 V.

According to this embodiment, it is confirmed that the off-state current is sufficiently small in a transistor including a highly purified oxide semiconductor.

Such a transistor in which an oxide semiconductor having a wide band gap is used for a semiconductor film can realize an extremely small off-state current.

In the circuit diagrams in this specification, a transistor using an oxide semiconductor is put down with a symbol "OS" so as to be clearly identified as a transistor using an oxide semiconductor.

The other of the source and the drain of the transistor 107 and the other terminal of the capacitor 110 are connected to a ground potential line. The recovery switch 105a and the diode 105b are connected in parallel. One end of the recovery switch 105a and an anode of the diode 105b are electrically connected to each other and a signal of the node (A) is inputted thereto. The other end of the recovery switch 105a and the cathode of the diode 105b are electrically connected to each other and a signal is outputted to the node (B).

Further, by providing the recovery switch 105a, when the data stored in the node (OS) is restored, the data can be prevented from being destroyed by the output of the inverter 103. Furthermore, by providing the diode 105b, when the data stored in the node (OS) is restored, the flow of a large amount of flow-through current to the inverter 108 can be suppressed and power consumption can be reduced.

<An Example of a Circuit Operation>

Next, a circuit operation at the time of storing and restoring data is described with reference to FIGS. 2A and 2B, FIGS. 3A and 3B, FIGS. 4A and 4B, FIG. 5, and FIG. 6. FIGS. 2A and 2B, FIGS. 3A and 3B, FIGS. 4A and 4B, and FIG. 5 are diagrams illustrating operations of the latch circuit 100, and FIG. 6 is a timing chart. Note that slash lines in the timing chart show that the latch circuit can be in any state. For example, in D in FIG. 6, transmission of $V_{data}$ may be continued or not.

First, storing of data is described.

Figure 2A:
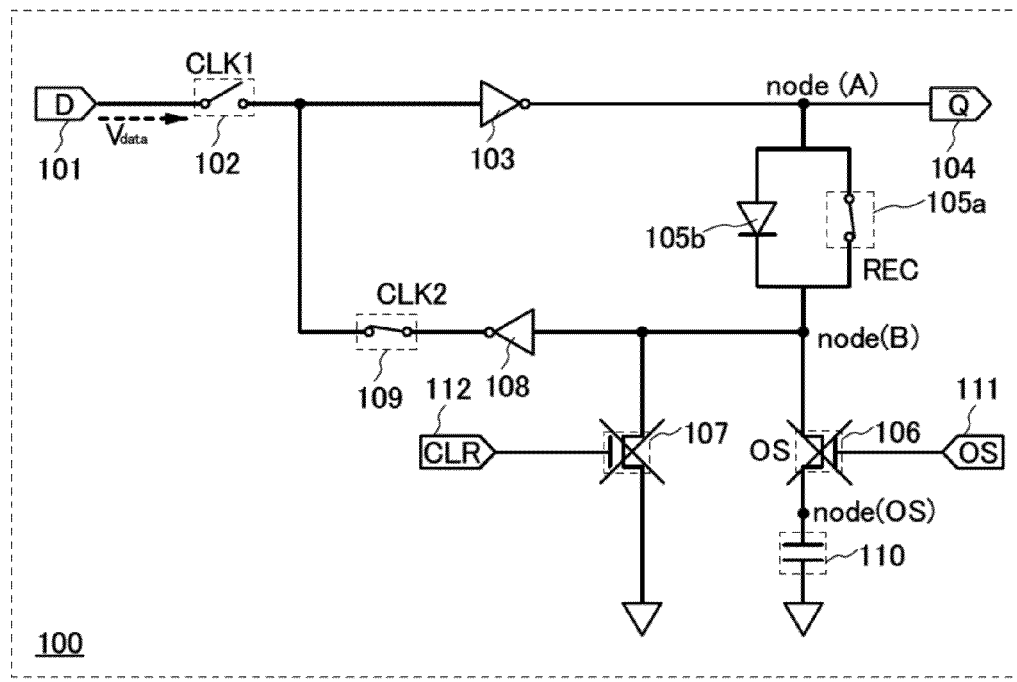
FIGS. 2A and 2B are diagrams each illustrating an operation of the latch circuit according to one embodiment of the present invention.
Figure 2B:
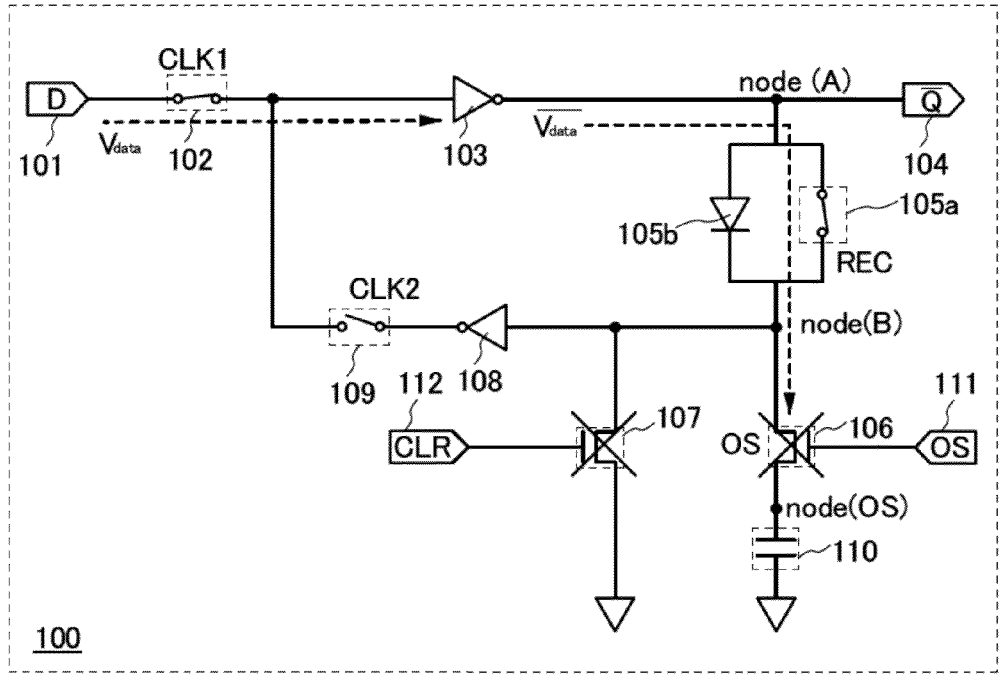

In an initial state of each component, the recovery switch 105a is on, the transistor 106 and the transistor 107 are off, and each of the potentials (data) stored in the node (A) and the node (B) is a given potential (see FIG. 2A). Note that a non-operation state of the transistor is represented by a cross mark (x) in the drawings.

First, the switch 102 is turned on and the switch 109 is turned off by the clock signal CLK1 and the clock signal CLK2, respectively, and $V_{data}$ is inputted to the inverter 103 from the input terminal 101. An output potential inverted by the inverter 103 (/$V_{data}$) changes the potential of the node (A) and the node (B) into /$V_{data}$ (see FIG. 2B).

Next, the switch 102 is turned off and the switch 109 is turned on by the clock signal CLK1 and the clock signal CLK2, respectively. After that, the transistor 106 is turned on by a signal of the input terminal 111, and the node (B) is connected to the node (OS). By connecting the node (B) to the node (OS), the data (potential: /$V_{data}$) stored in the node (B) is transmitted to the node (OS) (see FIG. 3A).

Figure 3A:
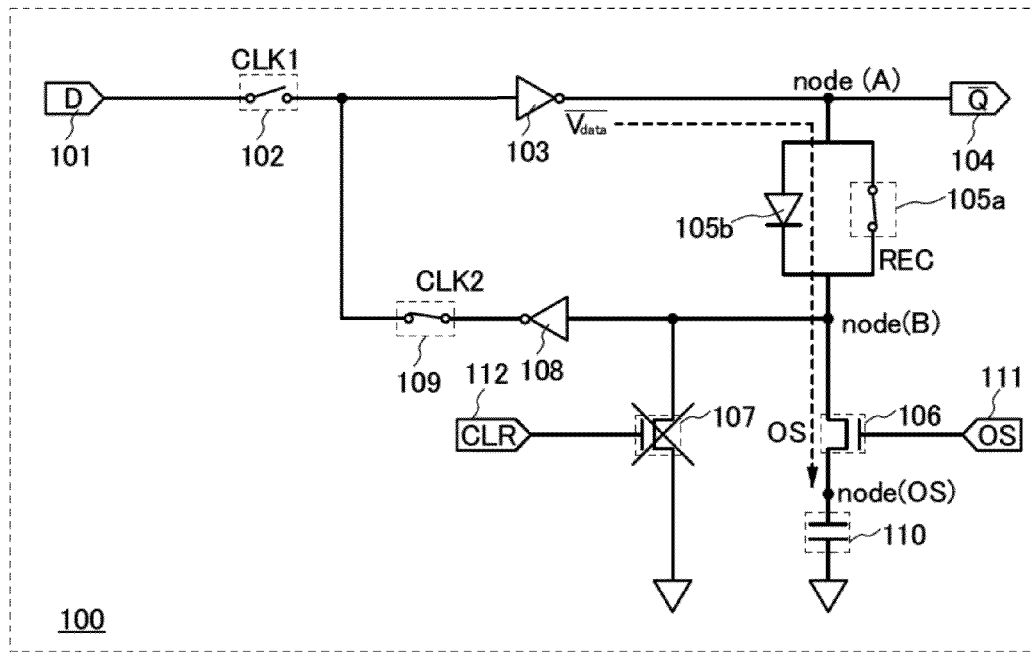
FIGS. 3A and 3B are diagrams each illustrating an operation of the latch circuit according to one embodiment of the present invention.
Figure 3B:
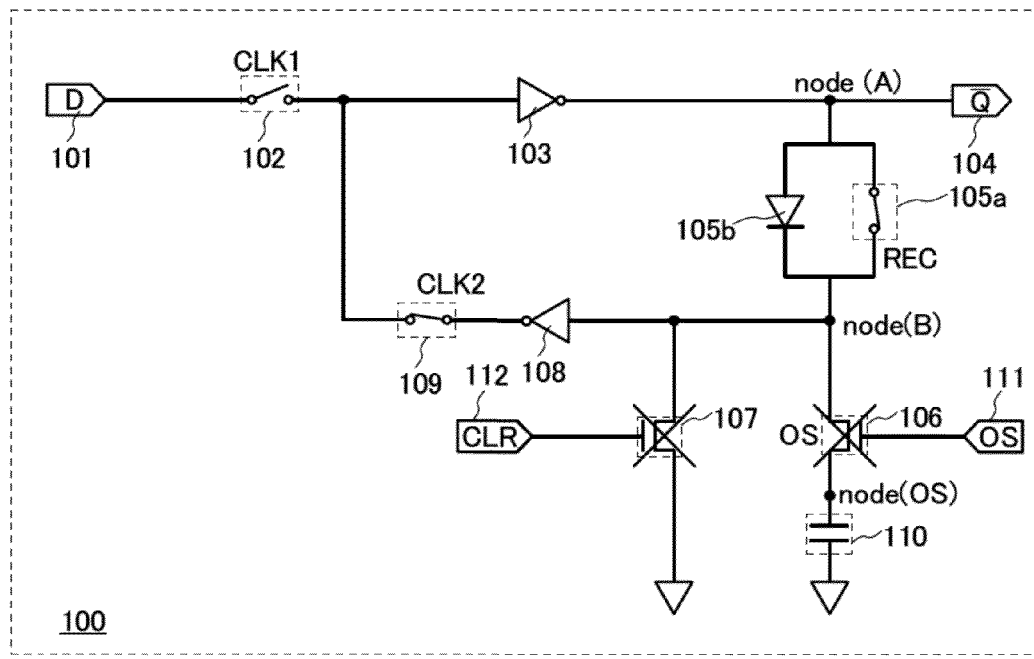

Then, after the transmission to the node (OS) is finished, the transistor 106 is turned off, and the data is stored (see FIG. 3B). By providing the capacitor 110, data (potential) is easily stored and the variation in the potential of the node (OS) due to the variation in potentials of wirings which connect each component can be easily suppressed.

The value of the off-state current (leakage current) of the transistor 106 is extremely low. Therefore, the transistor 106 is turned off after the potential of the node (OS) is set to a specific value (/$V_{data}$ in this embodiment), whereby the potential can be kept constant or almost constant. Consequently, data can be accurately stored in the latch circuit 100.

Next, restoring of data which is stored in the node (OS) is described.

Before restoring the data which is stored in the node (OS), the transistor 107 is turned on by a signal of the input terminal 112 and the recovery switch 105a is turned off by the clock signal REC, so that the node (B) is connected to the ground potential line. By connecting the node (B) to the ground potential line, the potential of the node (B) is changed into Low potential. Then, the potential of the node (B) changes the potential of the node (A) into the Low potential through the inverter 108 and the inverter 103. Note that this processing is also referred to as reset processing (see FIG. 4A).

Figure 4A:
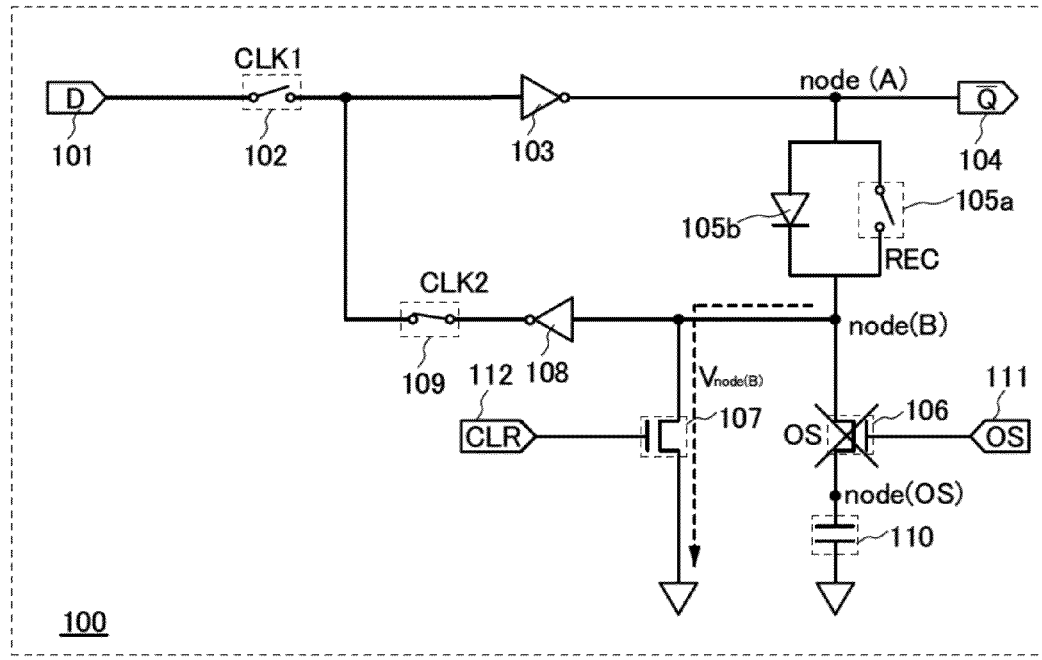
FIGS. 4A and 4B are diagrams each illustrating an operation of the latch circuit according to one embodiment of the present invention.
Figure 4B:
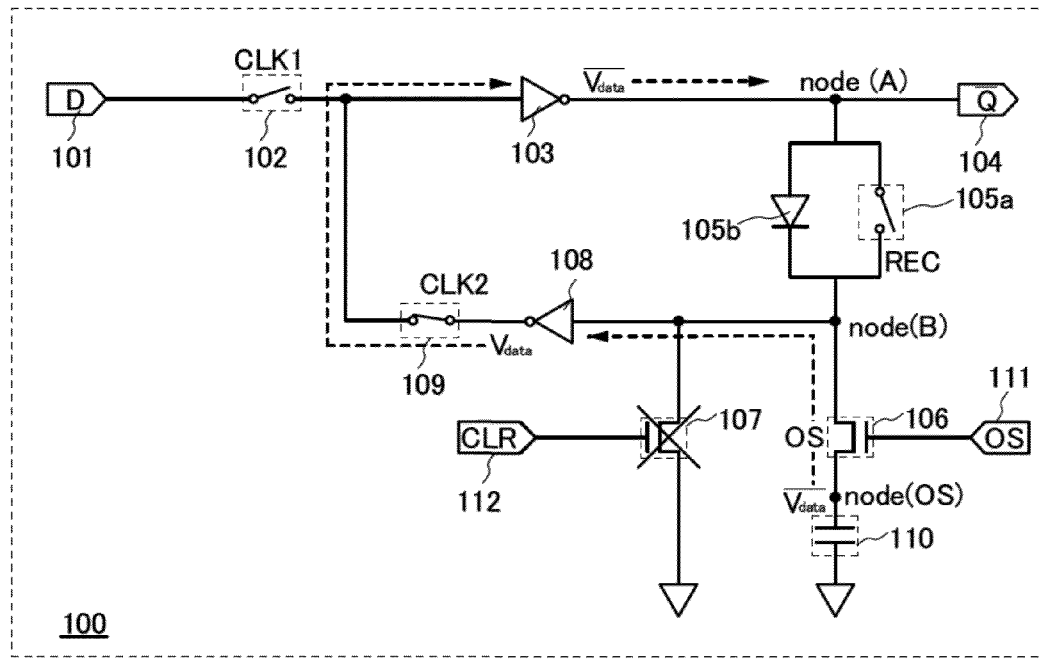

Next, the transistor 107 is turned off, and the transistor 106 is turned on by the signal of the input terminal 111, whereby the data (/$V_{data}$) of the node (OS) is transmitted to the node (B) (see FIG. 4B).

Here, in the case where the data (/$V_{data}$) stored in the node (OS) is Low potential (that is, $V_{data}$ is High potential), the potential of the node (B) remains Low potential and is not changed. In other words, the potentials of the node (A) and the node (B) are kept in the state where the reset processing is performed.

Alternatively, here, in the case where the data (/$V_{data}$) stored in the node (OS) is High potential (that is, $V_{data}$ is Low potential), the potential of the node (B) rises. However, depending on the threshold voltage or a capacitive division internal to the latch circuit, there is a possibility that the potential of the node (B) will not be sufficient to keep a flow-through current from flowing through the inverter 108, even if the potential of the node (B) attains a High potential sufficient to invert the output of the inverter 108 with the charge transmitted from the node (OS). At this time, when the charge of the node (B) is inputted to the inverter 108 and increases to the potential which is sufficient to invert the output of the inverter 108, the inverter 103 inverts Low potential and outputs High potential and the High potential is fed back to the node (B) through the diode 105b.

With the configuration of the latch circuit 100, when the potential of the input of the inverter 108 is sufficient to invert the output of the inverter 108 by the charge of the node (OS), the output is transmitted to the inverter 103 and charge supply to the input terminal of the inverter 108 can be performed from not only the node (OS) but also the node (A) through the diode 105b. Therefore, rising of the input potential of the inverter 108 is quick and a period in which an intermediate potential (a potential which let a large amount of flow-through current flow) is inputted is shortened, and a period in which flow-through current of the inverter 108 flows is shortened, so that the flow of the large amount of flow-through current to the inverter 108 can be suppressed and power consumption can be reduced. Further, time necessary for restoring data can be shortened. That is, even when the power supply is restarted in the state of storing data, the data can be restored immediately (that is, data can be restored at high speed).

Figure 5:
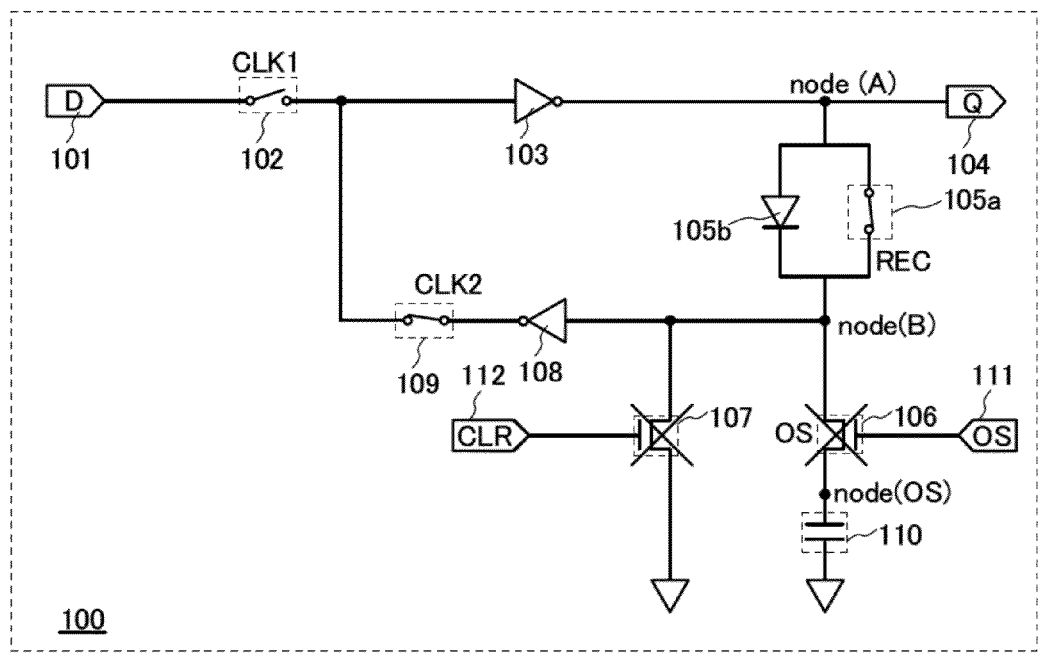
FIG. 5 is a diagram illustrating an operation of the latch circuit according to one embodiment of the present invention.
Figure 6:
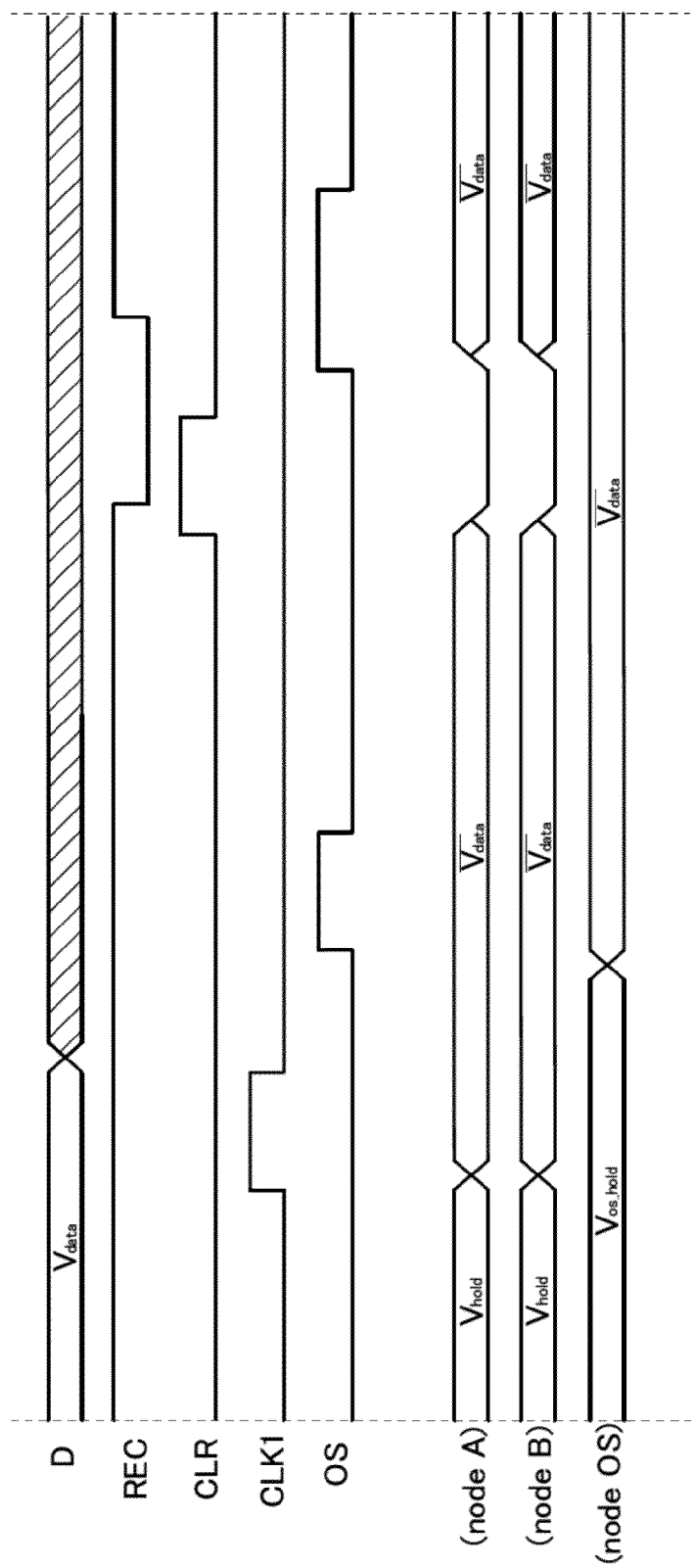
FIG. 6 is a timing chart at the time of the operation of the latch circuit according to one embodiment of the present invention.

Next, the transistor 106 is turned off and the recovery switch 105a is turned on (see FIG. 5).

In this manner, the data can be restored and the data (/$V_{data}$) can be outputted to the output terminal 104. When $V_{data}$ which has been inputted to the input terminal 101 is to be outputted to the output terminal 104, for example, an inverter is preferably provided between the output terminal 104 and the node (A). Alternatively, an inverter is provided between the input terminal 101 and the switch 102, $V_{data}$ which has been inputted to the input terminal 101 is stored in the node (OS), and $V_{data}$ may be outputted to the output terminal 104.

Further, in this embodiment, the configuration in which the cathode of the diode 105b is electrically connected to the transistor 106, the transistor 107, and the inverter 108 is used; however, the configuration is not limited thereto, and a circuit in which the cathode of the diode 105b is electrically connected to the inverter 103 and the output terminal 104 may be designed as appropriate.

The structures, methods, and the like described in this embodiment can be combined with structures, methods, and the like described in the other embodiments, as appropriate.

Embodiment 2

Figure 7:
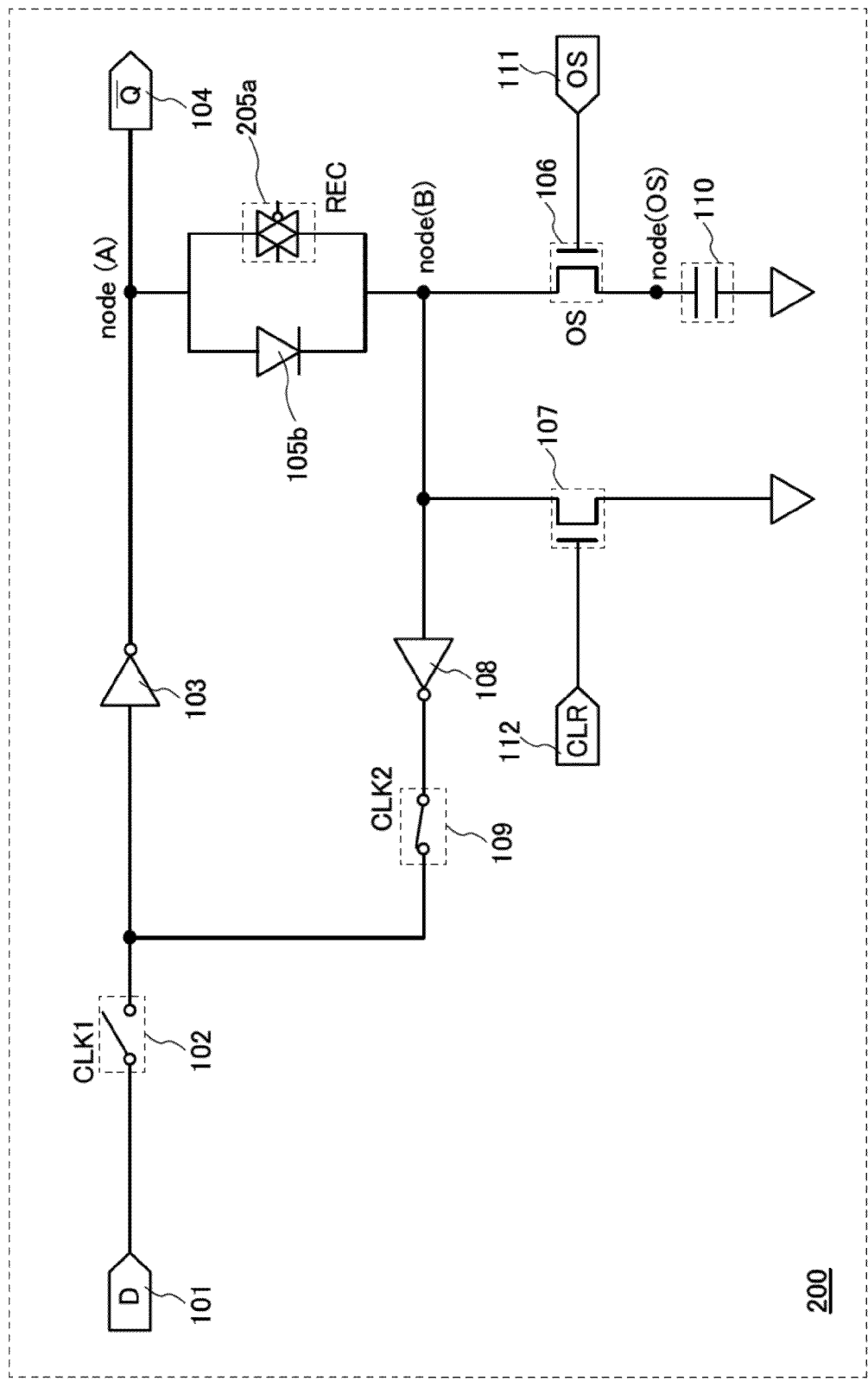
FIG. 7 is a diagram illustrating a latch circuit according to one embodiment of the present invention.

In this embodiment, a latch circuit of another embodiment of the present invention is described with reference to FIG. 7.
<Example of Circuit Configuration>
First, a circuit configuration of a latch circuit 200 in this embodiment is described with reference to FIG. 7. FIG. 7 shows a nonvolatile D latch circuit.

The latch circuit 200 illustrated in FIG. 7 includes the input terminal 101, the switch 102 to which the signal from the input terminal 101 is inputted, the inverter 103 which is electrically connected to the switch 102 and to which the output of the input terminal 101 is inputted, the output terminal 104, a transmission gate 205a, and the diode 105b, to which the output signal of the inverter 103 is inputted, the transistor 106, the transistor 107, and the inverter 108, electrically connected to the transmission gate 205a and the cathode of the diode 105b, the switch 109 which is electrically connected to the inverter 103 and to which the output of the inverter 108 is inputted, the capacitor 110 electrically connected to one of the source and the drain of the transistor 106, the input terminal 111 electrically connected to the gate of the transistor 106, and the input terminal 112 electrically connected to the gate of the transistor 107.

The configuration of this embodiment is different from that of Embodiment 1 in that the recovery switch 105a is replaced with the transmission gate 205a, and the other configurations of this embodiment are the same as those of Embodiment 1.

In a transmission gate, two or more transistors with different conductivities are connected in parallel; for example, an n-channel transistor and a p-channel transistor are connected in parallel. When clock signals having opposite phases are added to the n-channel transistor and the p-channel transistor, a low potential is applied to a gate of the p-channel transistor when a high potential is applied to a gate of the n-channel transistor; thus, both the transistors are turned on or off at the same time. The transistors operate complementarily in that the n-channel transistor mainly operates when both the transistors are turned on or Low potential is transmitted by the transmission gate, and the p-channel transistor mainly operates when High potential is transmitted by the transmission gate, whereby a change in potential depending on the threshold voltage can be prevented and a potential can be appropriately transmitted.

Further, as the diode 105b, a diode-connected transistor may be used as Embodiment 1. The diode-connected transistor can be manufactured in the same process as another transistor (e.g., the transistor 107); therefore, the manufacturing process can be simplified.

The transmission gate 205a and the diode 105b are connected in parallel. One end of the transmission gate 205a and an anode of the diode 105b are electrically connected to each other and a signal of the node (A) is inputted thereto. The other end of the transmission gate 205a and the cathode of the diode 105b are electrically connected to each other and a signal is outputted to the node (B).

Further, by providing the transmission gate 205a, when the data stored in the node (OS) is restored, the data can be prevented from being destroyed by the output of the inverter 103. Furthermore, by providing the diode 105b, when the data stored in the node (OS) is restored, the flow of a large amount of flow-through current to the inverter 108 can be suppressed and power consumption can be reduced.

<An Example of a Circuit Operation>
The circuit operation at the time of storing and restoring data of this embodiment is different from that of Embodiment 1 in that the on state and the off state of the recovery switch 105a by the clock signal REC is replaced with an on state and an off state of the transmission gate 205a by the clock signal REC, and Embodiment 1 can be referred to for the circuit operation.

The structures, methods, and the like described in this embodiment can be combined with structures, methods, and the like described in the other embodiments, as appropriate.

Embodiment 3

Figure 8:
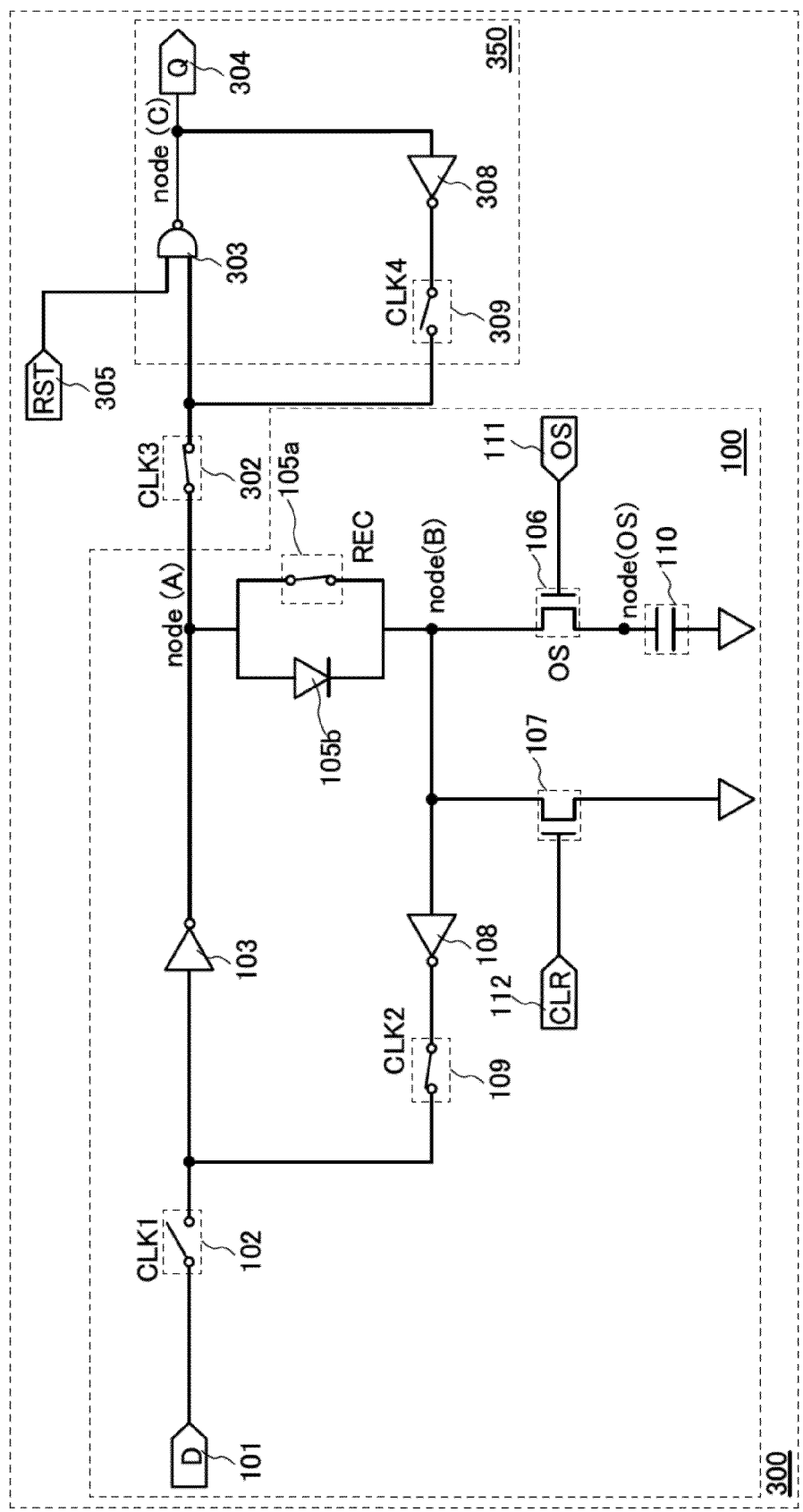
FIG. 8 is a diagram illustrating a semiconductor device including the latch circuit according to an embodiment of the present invention.

In this embodiment, a semiconductor device using either of the latch circuit described in the above embodiments is described with reference to FIG. 8. FIG. 8 illustrates a D flip-flop 300 including the latch circuit 100 described in Embodiment 1.

The D flip-flop is a circuit in which latch circuits are connected in series, and the D flip-flop 300 in this embodiment includes the latch circuit 100 described in Embodiment 1, a conventional latch circuit 350, a switch 302 that electrically connects the latch circuit 100 and the latch circuit 350, and a reset terminal 305. Note that the latch circuit 100 does not include an output terminal. In this embodiment, a configuration in which the latch circuit 100 is provided in a previous stage and the latch circuit 350 is provided in a subsequent stage is employed; however, the configuration is not limited thereto, and in this embodiment, a configuration in which the latch circuit 350 is provided in the previous stage and the latch circuit 100 is provided in the subsequent stage or a configuration in which the latch circuit 100 is provided in each of the previous stage and the subsequent stage may be employed. Alternatively, the latch circuit 200 described in Embodiment 2 may be used instead of the latch circuit 100.

The latch circuit 350 is electrically connected to the switch 302, and includes a NAND gate 303 to which a signal from the reset terminal 305 is inputted, an output terminal 304 and an inverter 308 to which a signal outputted from the NAND gate 303 is inputted, and a switch 309 which is electrically connected between an input of the NAND gate 303 and an output of the inverter 308.

An on state and an off state of the switch 302 and the switch 309 are changed by a clock signal inputted from CLK3 and CLK4. CLK3 and CLK4 have an inverted relationship; thus, when the switch 302 is on, the switch 309 is off, and when the switch 302 is off, the switch 309 is on. Further, CLK1 and CLK3 have an inverted relationship; thus, when the switch 109 is on, the switch 302 is also on. At this time, it is preferable that, first, a switch which is on be turned off; then, a switch which is off be turned on. In this manner, a signal can be appropriately sent without mixing.

When a signal (Low potential) from the reset terminal 305 is inputted to the NAND gate 303 (reset processing), the NAND gate 303 outputs High potential regardless of the potential of the node (A).

Further, a node which is formed by connection of the NAND gate 303, the output terminal 304, and the inverter 308 is referred to as a node (C).

<An Example of a Circuit Operation>
Embodiment 1 (FIGS. 2A and 2B, FIGS. 3A and 3B, FIGS. 4A and 4B, and FIG. 5) can be referred to for the steps to the operation of transmitting the data stored in the node (OS) to the node (A). At this time, the switch 302 is on and the data ($V_{data}$) of the node (A) is inputted to the NAND gate 303.

Next, an output ($\overline{V_{data}}$) inverted by the NAND gate 303 is inputted to the inverter 308.

Then, an output ($\overline{V_{data}}$) inverted by the inverter 308 is inverted by the NAND gate 303 when the switch 309 is turned on, and the output ($V_{data}$) is inputted to the output terminal 304. Further, for example, an inverter is provided between the input terminal 101 and the switch 102, $V_{data}$ which has been inputted to the input terminal 101 is stored in the node (OS), an inverter is provided between the node (A) and the switch 302 or between the output terminal 304 and the node (C), and the $V_{data}$ may be outputted to the output terminal 304.

The structures, methods, and the like described in this embodiment can be combined with structures, methods, and the like described in the other embodiments, as appropriate.

Embodiment 4

In this embodiment, one example of the manufacturing method of the latch circuit described in the above embodiment is described using FIGS. 9A to 9E, FIGS. 10A to 10D, FIGS. 11A to 11C, and FIGS. 12A and 12B. First, a manufacturing method of a transistor in a lower portion of the latch circuit is described, and then, a manufacturing method of a transistor in an upper portion of the level-shift circuit is described.

In cross-sectional views each illustrating a manufacturing process in FIGS. 9A to 9E, FIGS. 10A to 10D, FIGS. 11A to 11C, and FIGS. 12A and 12B, A1-A2 shows steps in the case of manufacturing an n-channel transistor as the transistor described in the above embodiments, and B1-B2 shows steps in the case of manufacturing a p-channel transistor as the transistor described in the above embodiments. Note that a transistor 510 described in this embodiment corresponds to the transistor 106 described in the above embodiments and a transistor 430 or a transistor 440 described in this embodiment corresponds to the transistor 107 or the transistor forming the inverter described in the above embodiments.

<Method for Manufacturing Transistor in Lower Portion>

Figure 9A:
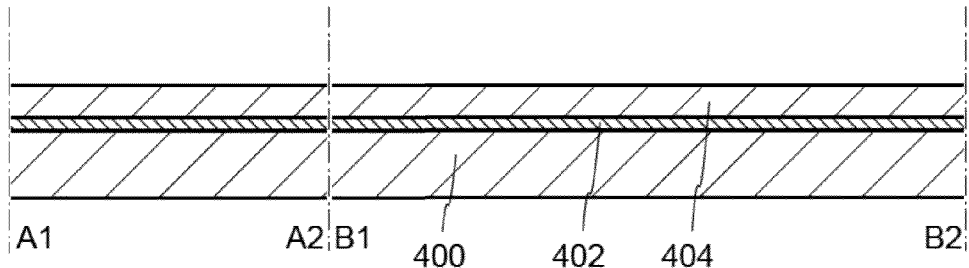
FIGS. 9A to 9E are diagrams illustrating an example of a manufacturing process of the latch circuit.

First, a substrate 400 over which a semiconductor film 404 is provided with an insulating film 402 provided therebetween is prepared (see FIG. 9A).

As the substrate 400, for example, a single crystal semiconductor substrate or a polycrystalline semiconductor substrate of silicon, silicon carbide, or the like, or a compound semiconductor substrate of silicon germanium, gallium arsenide, indium phosphide, or the like can be used. Further, a variety of glass substrates that are used in the electronics industry, such as substrates of aluminosilicate glass, aluminoborosilicate glass, and barium borosilicate glass, a quartz substrate, a ceramic substrate, and a sapphire substrate can also be used.

The insulating film 402 has a single-layer structure or a stacked-layer structure containing silicon oxide, silicon oxynitride, silicon nitride, or the like. As examples of the forming method of the insulating film 402, a thermal oxidation method, a CVD method, a sputtering method, and the like can be given. The thickness of the insulating film 402 is greater than or equal to 1 nm and less than or equal to 100 nm, preferably greater than or equal to 10 nm and less than or equal to 50 nm.

As the semiconductor film 404, a single crystal semiconductor material or a polycrystalline semiconductor material made of silicon, silicon carbide, or the like, or a compound semiconductor material made of silicon germanium, gallium arsenide, indium phosphide, or the like can be used. Since the semiconductor film 404 does not contain an oxide semiconductor material, the semiconductor film 404 is also referred to as a semiconductor material other than an oxide semiconductor.

It is preferable to use a single crystal semiconductor material made of silicon or the like for the semiconductor film 404 because it enables the operation speed of the transistors to be fast.

Further, an SOI (silicon on insulator) substrate can also be used as the substrate 400 over which the semiconductor film 404 is provided with the insulating film 402 provided therebetween. Although the "SOI substrate" generally means a substrate in which a silicon layer is provided on an insulating surface, the SOI substrate in this specification and the like also encompasses a substrate in which a semiconductor film of a material other than silicon is provided on an insulating surface. That is, the semiconductor film included in the "SOI substrate" is not limited to a silicon layer. Moreover, the SOI substrate also encompasses a structure in which a semiconductor film is provided over an insulating substrate such as a glass substrate with an insulating film provided therebetween. In this embodiment, the case is described in which an SOI substrate in which a silicon film is provided over a single crystal silicon substrate with a silicon oxide film provided therebetween is used as the substrate 400 over which the semiconductor film 404 is provided with the insulating film 402 provided therebetween.

Next, the semiconductor film 404 is processed into an island shape to form a semiconductor film 404a (or a semiconductor film 404b). For the processing method, dry etching is preferably used, but wet etching may be used. The etching gas and the etchant can be selected as appropriate depending on a material of the layer to be etched.

Figure 9B:
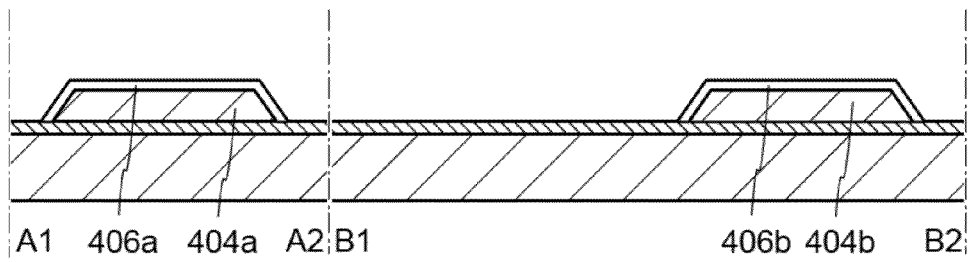

Next, a gate insulating film 406a (or a gate insulating film 406b) is formed so as to cover the semiconductor film 404a (or the semiconductor film 404b) (see FIG. 9B). The gate insulating film 406a (or the gate insulating film 406b) can be formed, for example, by heat treatment (e.g., thermal oxidation treatment or thermal nitridation treatment) on a surface of the semiconductor film 404a (or the semiconductor film 404b). High-density plasma treatment may be used instead of the heat treatment. The high-density plasma treatment can be performed using, for example, a mixed gas of a rare gas such as He, Ar, Kr, or Xe and any of oxygen, nitrogen oxide, ammonia, nitrogen, hydrogen, and the like. Needless to say, the gate insulating film may be formed by a CVD method, a sputtering method, or the like.

The gate insulating film 406a (or the gate insulating film 406b) can be formed using silicon oxide, silicon oxynitride, silicon nitride, hafnium oxide, aluminum oxide, tantalum oxide, or the like. Alternatively, the gate insulating film can be formed using a material with a high dielectric constant (a high-k material) such as hafnium oxide, yttrium oxide, hafnium silicate ($HfSi_xO_y$ (x>0, y>0)), hafnium silicate to which nitrogen is added ($HfSi_xO_y$ (x>0, y>0)), or hafnium aluminate to which nitrogen is added ($HfAl_xO_y$ (x>0, y>0)). The gate insulating film is formed to have a single-layer structure or a stacked-layer structure using any of the above materials. Further, the thickness of the gate insulating film 406a (or the gate insulating film 406b) can be, for example, greater than or equal to 1 nm and less than or equal to 100 nm, preferably greater than or equal to 10 nm and less than or equal to 50 nm.

Such a small thickness of the gate insulating film as described above leads to a problem of gate leakage due to a tunnel effect or the like. To solve the problem of gate leakage, the above-described high-k material is preferably used for the gate insulating film. The use of a high-k material for the gate insulating film makes it possible to increase the thickness in order to suppress gate leakage while ensuring electric characteristics. A stacked-layer structure of a film containing a high-k material and a film containing any one of silicon oxide, silicon nitride, silicon oxynitride, silicon nitride oxide, aluminum oxide, and the like may be employed therefore.

In this embodiment, a silicon oxide film is formed by thermal oxidation treatment, whereby the gate insulating film 406a (or the gate insulating film 406b) is formed.

Figure 9C:
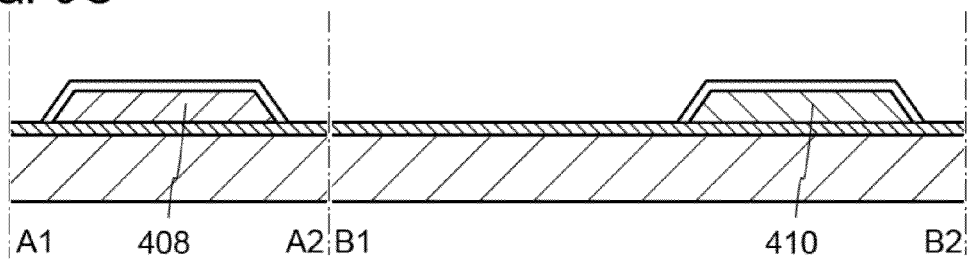

Next, an impurity element imparting n-type conductivity and an impurity element imparting p-type conductivity are added to the semiconductor film 404a (or the semiconductor film 404b) through the gate insulating film 406a (or the gate insulating film 406b) in order to control the threshold voltages of the transistors (see FIG. 9C). In the case where silicon is used for the semiconductor film 404a (or the semiconductor film 404b), phosphorus, arsenic, or the like can be used as the impurity element imparting n-type conductivity. On the other hand, boron, aluminum, gallium, or the like can be used as the impurity element imparting p-type conductivity. In this embodiment, boron is added to the semiconductor film 404a through the gate insulating film 406a, so that an impurity region 408 is formed, and phosphorus is added to the semiconductor film 404b through the gate insulating film 406b, so that an impurity region 410 is formed.

Figure 9D:
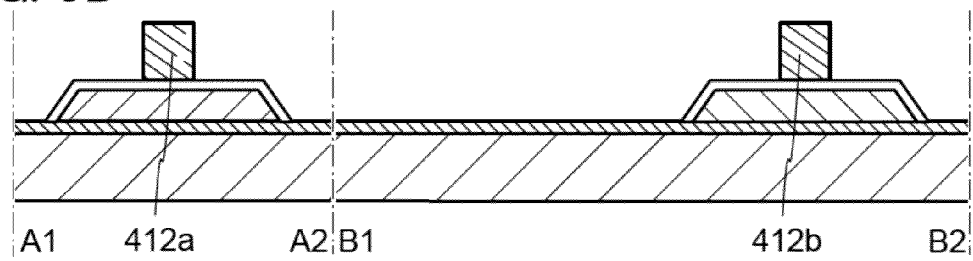

Next, a conductive film for forming a gate electrode (including a wiring formed in the same layer as the gate electrode) is formed over the gate insulating film 406a (or the gate insulating film 406b) and is processed, so that a gate electrode 412a (or a gate electrode 412b) is formed (see FIG. 9D).

The conductive film used for the gate electrode 412a (or the gate electrode 412b) can be formed using a metal material such as aluminum, copper, titanium, tantalum, or tungsten. Alternatively, a layer containing a conductive material may be formed using a semiconductor material such as polycrystalline silicon. There is no particular limitation on the method for forming the conductive film; a variety of film formation methods such as an evaporation method, a CVD method, a sputtering method, and a spin coating method can be used. The conductive film can be processed by etching using a resist mask. In this embodiment, a tantalum nitride film and a tungsten film are stacked by a sputtering method and processed, so that the gate electrode 412a (or the gate electrode 412b) is formed.

Figure 9E:
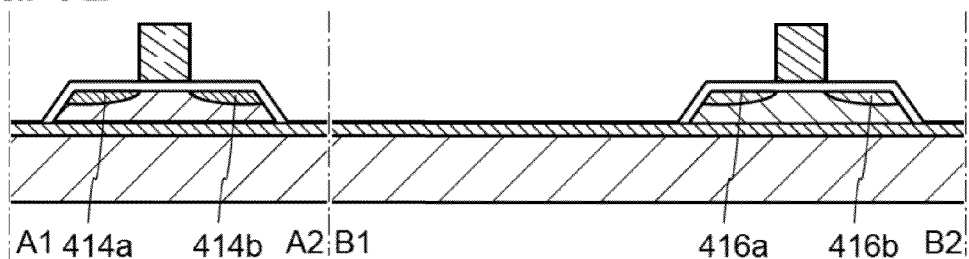

Next, an impurity element imparting n-type conductivity (or an impurity element imparting p-type conductivity) is added to the semiconductor film 408 (or the semiconductor film 410) using the gate electrode 412a (or the gate electrode 412b) as a mask through the gate insulating film 406a (or the gate insulating film 406b) (see FIG. 9E). In this embodiment, phosphorus is added to the impurity region 408 through the gate insulating film 406a, so that low-concentration impurity regions 414a and 414b are formed, and boron is added to the impurity region 410 through the gate insulating film 406b, so that low-concentration impurity regions 416a and 416b are formed.

Figure 10A:
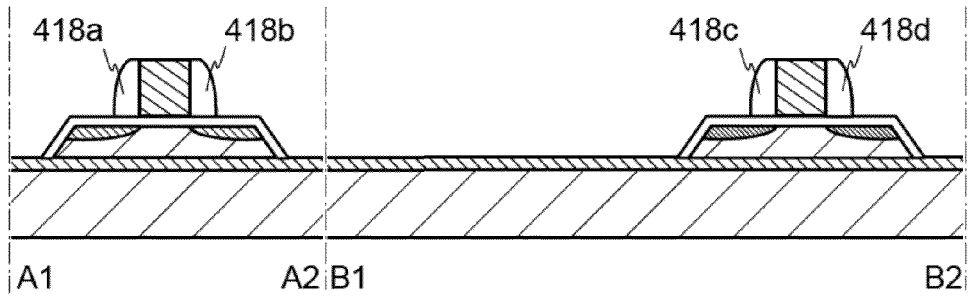
FIGS. 10A to 10D are diagrams illustrating an example of the manufacturing process of the latch circuit.

Next, sidewall insulating films 418a and 418b (or sidewall insulating films 418c and 418d) having a sidewall structure are formed on side surfaces of the gate electrode 412a (or the gate electrode 412b) (see FIG. 10A). The sidewall insulating films 418a and 418b (or the sidewall insulating films 418c and 418d) having the sidewall structure may be formed on the side surfaces of the gate electrode 412a (or the gate electrode 412b) in such a self-aligned manner that an insulating film that covers the gate electrode 412a (or the gate electrode 412b) is formed and then processed by anisotropic etching by a reactive ion etching (RIE) method. There is no particular limitation on the insulating film; for example, a silicon oxide film with favorable step coverage, which is formed by reacting tetraethyl orthosilicate (TEOS), silane, or the like with oxygen, nitrous oxide, or the like, can be used. A silicon oxide film formed by a low temperature oxidation (LTO) method may also be used. The insulating film can be formed by a thermal CVD method, a plasma-enhanced CVD method, an atmospheric pressure CVD method, a bias ECRCVD method, a sputtering method, or the like.

Figure 10B:
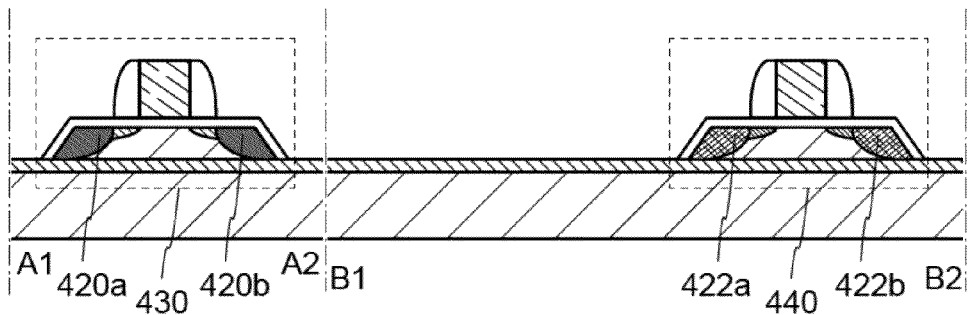

Next, an impurity element imparting n-type conductivity (or an impurity element imparting p-type conductivity) is added to the semiconductor film 408 (or the semiconductor film 410) using the gate electrode 412a (or the gate electrode 412b) and the sidewall insulating films 418a and 418b (or the sidewall insulating films 418c and 418d) as masks through the gate insulating film 406a (or the gate insulating film 406b) (see FIG. 10B). In this embodiment, phosphorus is added to the semiconductor film 404a through the gate insulating film 406a, so that high-concentration impurity regions 420a and 420b are formed, and boron is added to the semiconductor film 404b through the gate insulating film 406b, so that high-concentration impurity regions 422a and 422b are formed.

Through the above, the n-channel transistor 430 or the p-channel transistor 440 can be manufactured using the substrate 400 containing a semiconductor material other than an oxide semiconductor (see FIG. 10B). Such transistors are capable of high-speed operation. Therefore, it is preferable to use the transistors as the transistor 107 or the like in the above embodiments because it enables the operation speed of them to be fast.

Figure 10C:
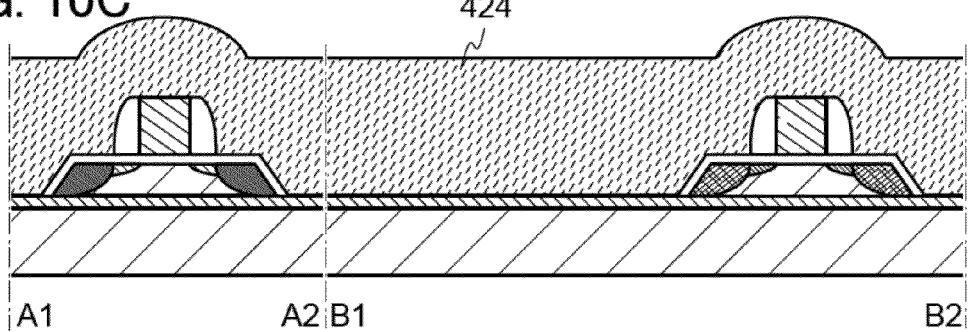

Next, an insulating film 424 is formed so as to cover the transistor 430 (or the transistor 440) (see FIG. 10C). The insulating film 424 can be formed using a material containing an inorganic insulating material such as silicon oxide, silicon oxynitride, silicon nitride, or aluminum oxide. A material with a low dielectric constant (low-k material) is preferably used for the insulating film 424 because it enables capacitance attributable to overlap of electrodes or wirings to be sufficiently reduced. A porous insulating film formed using any of the above-described material may also be used as the insulating film 424. The porous insulating film has a lower dielectric constant than an insulating film with high density and thus makes it possible to further reduce capacitance attributable to electrodes or wirings. An organic insulating material such as polyimide or acrylic can also be used to form the insulating film 424. In this embodiment, the case where the insulating film 424 is formed using silicon oxynitride is described.

After the insulating film 424 is formed, next, heat treatment is performed to activate the impurity elements added to the semiconductor film 404a (or the semiconductor film 404b). The heat treatment is performed using an annealing furnace. Alternatively, a laser annealing method or a rapid thermal annealing (RTA) method can be used. The heat treatment is performed at 400° C. to 600° C., typically 450° C. to 500° C. in a nitrogen atmosphere for 1 to 4 hours. By this heat treatment, in addition to activation of the impurity elements, hydrogen in the silicon oxynitride film of the insulating film 424 is released, so that hydrogenation of the semiconductor film 404a (or the semiconductor film 404b) can be performed.

Before or after any of the above steps, a step of forming an electrode, a wiring, a semiconductor film, an insulating film, or the like may be further performed. For example, an electrode, a wiring, or the like for connecting the transistor in the lower portion and the transistor in the upper portion is preferably formed. In addition, a multilayer wiring structure in which an insulating film and a conductive layer are stacked may be employed as a wiring structure, so that a highly-integrated semiconductor device can be realized.

<Method for Manufacturing Transistor in Upper Portion>

Figure 10D:
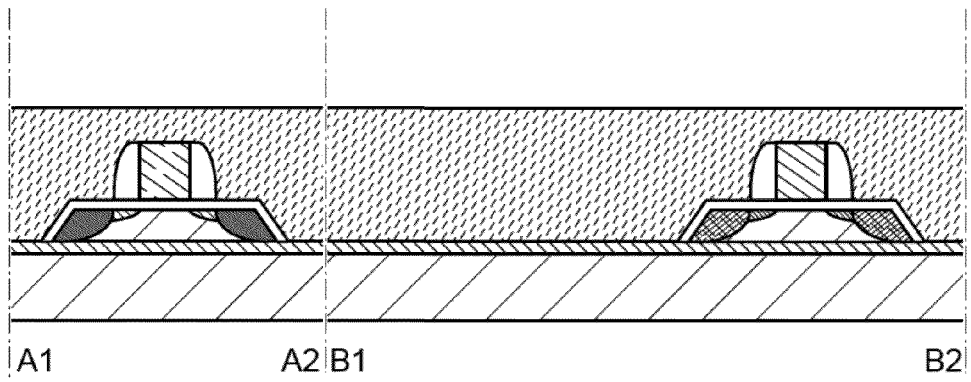

First, as treatment before formation of the transistor 510, a surface of the insulating film 424 is planarized (see FIG. 10D). As the planarization treatment of the insulating film 424, polishing treatment such as chemical mechanical polishing (hereinafter referred to as CMP treatment), etching treatment, plasma treatment, or the like can be used.

Here, the CMP treatment is a treatment of planarizing a surface of an object to be processed by a combination of chemical and mechanical actions. More specifically, the CMP treatment is a method in which a polishing cloth is attached onto a polishing stage, the polishing stage and an object to be processed are each rotated or swung while a slurry (abrasive) is supplied between the object and the polishing cloth, and the surface of the object is polished by a chemical reaction between the slurry and the object and by a mechanical polishing action of the polishing cloth on the object.

As the plasma treatment, a reverse sputtering in which an argon gas is introduced and plasma is produced can be performed. The reverse sputtering is a method in which voltage is applied to a substrate side with use of an RF power source in an argon atmosphere and plasma is generated in the vicinity of the substrate so that the surface is modified. Instead of the argon atmosphere, a nitrogen atmosphere, a helium atmosphere, an oxygen atmosphere, or the like may be used. The reverse sputtering can remove particle substances (also referred to as particles or dust) attached to the surface of the insulating film 424.

As the planarization treatment, polishing treatment, dry etching treatment, or plasma treatment may be performed plural times, or these treatments may be performed in combination. In the case where the treatments are combined, the order of treatments is not particularly limited and may be set as appropriate depending on the roughness of the surface of the insulating film 424.

With the planarization treatment on the insulating film 424, the average surface roughness ($R_a$) of the surface of the insulating film 424 can be reduced to 1 nm or less, preferably 0.3 nm or less, more preferably 0.1 nm or less. Note that $R_a$ is obtained by expanding, into three dimensions, the arithmetic mean surface roughness defined by JIS B 0601:2001 (ISO4287:1997) so that it can be applied to a curved surface, and can be expressed as an "average value of the absolute values of deviations from a reference surface to a specified surface" and is defined by the following formula.

$$Ra = \frac{1}{S_0} \int_{y_1}^{y_2} \int_{x_1}^{x_2} |f(x, y) - Z_0| dx dy \quad \text{[FORMULA 4]}$$

Here, the specified surface is a surface which is a target of roughness measurement, and is a quadrilateral region which is specified by four points at the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. In addition, $S_0$ represents the area of a rectangle which is obtained by projecting the specified surface on the xy plane, and $Z_0$ represents the height of the reference surface (the average height of the specified surface). Further, Ra can be measured using an atomic force microscope (AFM).

Next, a conductive film for forming a gate electrode (including a wiring formed in the same layer as the gate electrode) is formed over the planarized insulating film 424 and processed to form a gate electrode 498. The gate electrode 498 functions as a second gate electrode.

The gate electrode 498 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film of nickel silicide or the like may be used as the gate electrode 498. The gate electrode 498 has either a single-layer structure or a stacked-layer structure.

The gate electrode 498 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible to have a stacked-layer structure of the above-described conductive material and the above-described metal material.

Next, an insulating film 499 is formed over the insulating film 424 and the gate electrode 498. The insulating film 499 can be formed by a plasma-enhanced CVD method or a sputtering method to have a single-layer structure or a stacked-layer structure using an oxide insulating film of silicon oxide, silicon oxynitride, aluminum oxide, aluminum oxynitride, hafnium oxide, or gallium oxide; a nitride insulating film of silicon nitride, silicon nitride oxide, aluminum nitride, or aluminum nitride oxide; or a mixed material of these materials.

The insulating film 499 (in the case of the stacked-layer structure, the film in the stacked-layer structure, that is in contact with an oxide semiconductor film 502 formed later) preferably contains oxygen which exceeds at least the stoichiometric composition in the film (bulk). For example, in the case where a silicon oxide film is used as the insulating film 499, the amount of oxygen is preferably $SiO_{2+\alpha}$ (where $\alpha > 0$). By introducing oxygen into the insulating film 499 after the formation of the insulating film 499, the insulating film 499 containing much oxygen can be formed.

As the method of introducing oxygen, an ion implantation method, an ion doping method, a plasma immersion ion implantation method, plasma treatment, or the like can be used.

In an oxide semiconductor film, oxygen vacancy may be formed in the film formation or in the following heat treatment and processing. The oxygen vacancy formed in the oxide semiconductor film leads to formation of majority carriers, causing a problem of a shift in the threshold voltage of the transistor in the negative direction. Therefore, a treatment for decreasing the oxygen vacancy is preferably performed on the oxide semiconductor film.

For example, the insulating film 499 containing much (excess) oxygen, which serves as an oxygen supply source, may be provided so as to be in contact with the oxide semiconductor film 502 formed later, whereby oxygen is supplied from the insulating film 499 to the oxide semiconductor film 502. Heat treatment may be performed in the state where the oxide semiconductor film 502 and the insulating film 499 are at least partly in contact with each other to supply oxygen into the oxide semiconductor film 502. By using the insulating film 499 containing much oxygen, oxygen can be supplied to the oxide semiconductor film 502, so that oxygen vacancies in the oxide semiconductor film 502 can be reduced. Accordingly, formation of majority carriers can be suppressed.

In this embodiment, a 300-nm-thick silicon oxide film is formed by a sputtering method as the insulating film 499.

To improve the planarity of the surface of the oxide semiconductor film 502 formed later, planarization treatment is preferably performed on a region of the insulating film 499, which is in contact with the oxide semiconductor film 502. The planarization treatment can be performed in the similar manner to the planarization treatment performed on the insulating film 424. With the planarization treatment performed on the insulating film 499, the average surface roughness ($R_a$) of the surface of the insulating film 499 is reduced to preferably 1 nm or less, more preferably 0.3 nm or less, still more preferably 0.1 nm or less.

Figure 11A:
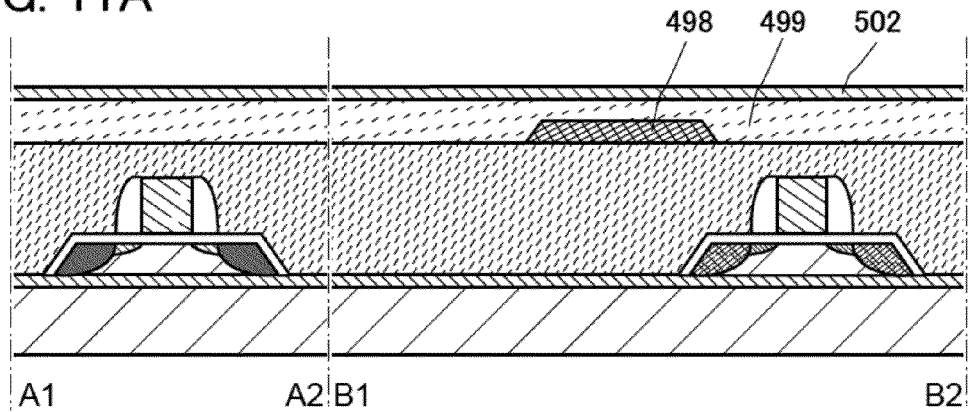
FIGS. 11A to 11C are diagrams illustrating an example of the manufacturing process of the latch circuit.
Figure 11B:
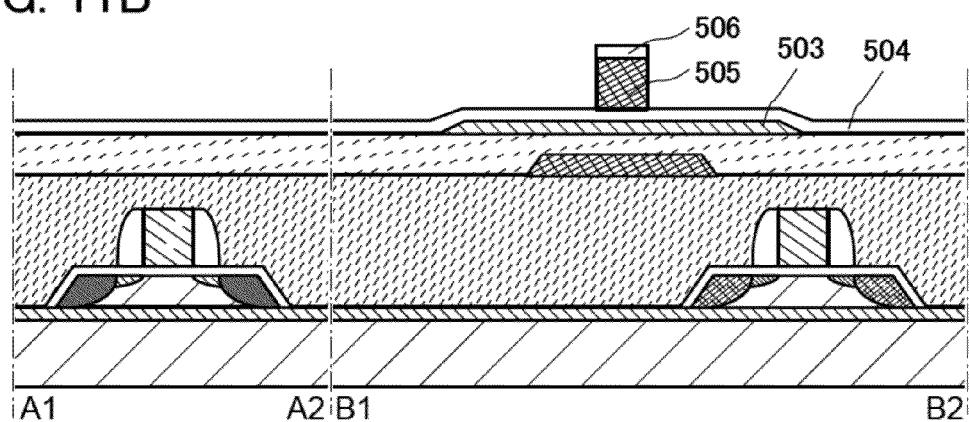
Figure 11C:
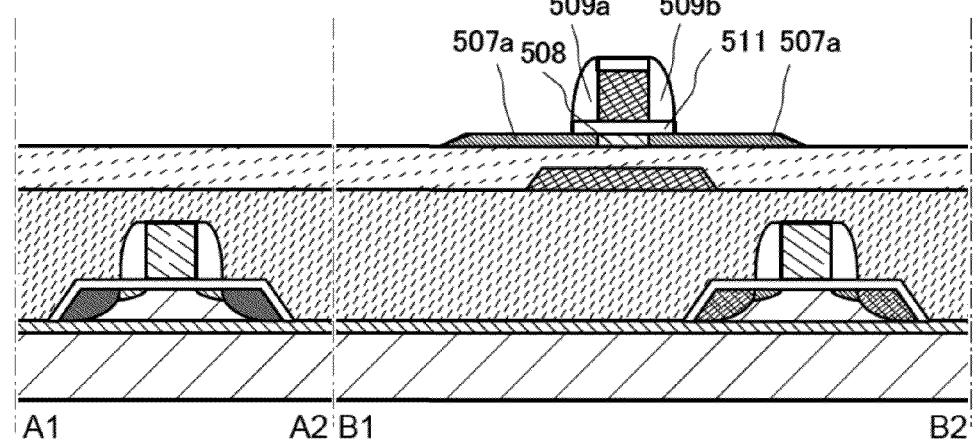

Next, the oxide semiconductor film 502 is formed over the insulating film 499 (see FIG. 11A). For example, an In-M-Zn—O-based material may be used. Here, a metal element M is an element whose bond energy with oxygen is higher than that of In and that of Zn. Alternatively, M is an element which has a function of suppressing desorption of oxygen from the In—M-Zn—O-based material. Owing to the effect of the metal element M, generation of oxygen vacancies in the oxide semiconductor film is suppressed. Thus, change in electrical characteristics of the transistor, which is caused by oxygen vacancies, can be reduced; accordingly, a highly reliable transistor can be obtained.

The metal element M can be, specifically, Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. The metal element M can be formed using one or more elements selected from the above elements. Further, Ge can be used instead of the metal element M.

Here, in an oxide semiconductor including In, M, Zn, and O, the higher the concentration of In is, the higher the carrier mobility and the carrier density are. As a result, the oxide semiconductor has higher conductivity as the concentration of In is higher.

The oxide semiconductor film 502 may have either a single-layer structure or a stacked structure. The oxide semiconductor film 502 may be in a single crystal state, a polycrystalline state, or an amorphous state.

Further, in this embodiment, the oxide semiconductor film 502 may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, the oxide semiconductor film 502 may include a CAAC-OS. In the CAAC-OS, for example, c-axes are aligned, and a-axes and/or b-axes are not macroscopically aligned.

For example, the oxide semiconductor film 502 may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, the oxide semiconductor film 502 may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the oxide semiconductor film 502 may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that the oxide semiconductor film 502 may be in a single-crystal state, for example.

The oxide semiconductor film 502 preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

The oxide semiconductor film is preferably in a supersaturated state in which oxygen which exceeds the stoichiometry is contained just after its deposition. For example, when an oxide semiconductor film is deposited by a sputtering method, it is preferable that the film be deposited in a deposition gas containing a high proportion of oxygen, and it is especially preferable that the film be formed in an oxygen atmosphere (oxygen gas 100%). When the deposition is performed in the condition where the proportion of oxygen in a deposition gas is large, particularly in a 100% oxygen gas atmosphere, a release of Zn from the film can be suppressed even at a deposition temperature higher than or equal to 300° C., for example.

Note that the oxide semiconductor film 502 may have a structure in which a plurality of oxide semiconductor films is stacked. For example, the oxide semiconductor film 502 may have a stacked-layer structure of a first oxide semiconductor film and a second oxide semiconductor film which are formed using metal oxides with different compositions. For example, the first oxide semiconductor film may be formed using a three-component metal oxide, and the second oxide semiconductor film may be formed using a two-component metal oxide. Alternatively, for example, both the first oxide semiconductor film and the second oxide semiconductor film may be formed using a three-component metal oxide.

Further, the constituent elements of the first oxide semiconductor film and the second oxide semiconductor film may be the same and the composition thereof may be different. For example, the first oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3.

At this time, one of the first oxide semiconductor film and the second oxide semiconductor film which is closer to the gate electrode (on a channel side) preferably contains In and Ga at a proportion of In>Ga. The other which is farther from the gate electrode (on a back channel side) preferably contains In and Ga at a proportion of In≤Ga.

In an oxide semiconductor, the s orbital of heavy metal mainly contributes to carrier transfer, and when the In proportion in the oxide semiconductor is increased, overlaps of the s orbitals are likely to be increased. Therefore, an oxide having a composition of In>Ga has higher mobility than an oxide having a composition of In≤Ga. Further, in Ga, the formation energy of an oxygen vacancy is larger and thus the oxygen vacancy is less likely to occur than in In; therefore, the oxide having a composition of In≤Ga has more stable characteristics than the oxide having a composition of In>Ga.

An oxide semiconductor containing In and Ga at a proportion of In>Ga is used on a channel side, and an oxide semiconductor containing In and Ga at a proportion of In≤Ga is used on a back channel side, whereby field-effect mobility and reliability of the transistor can be further improved.

Further, oxide semiconductors having different crystallinities may be used for the first oxide semiconductor film and the second oxide semiconductor film. That is, the oxide semiconductor film 502 may be formed by using any of a single crystal oxide semiconductor, a polycrystalline oxide semiconductor, an amorphous oxide semiconductor, and a CAAC-OS film, as appropriate. When an amorphous oxide semiconductor is used for at least one of the first oxide semiconductor film and the second oxide semiconductor film, internal stress or external stress of the oxide semiconductor film 502 is relieved, variation in characteristics of a transistor is reduced, and reliability of the transistor can be further improved.

On the other hand, an amorphous oxide semiconductor is likely to absorb an impurity which serves as a donor, such as hydrogen, and to generate an oxygen vacancy, and thus easily becomes an n-type. Thus, the oxide semiconductor film on the channel side is preferably formed using a crystalline oxide semiconductor such as a CAAC-OS film.

Further, the oxide semiconductor film 502 may have a stacked-layer structure of three or more layers in which an amorphous semiconductor film is interposed between a plurality of crystalline semiconductor films. Furthermore, a structure in which a crystalline semiconductor film and an amorphous semiconductor film are alternately stacked may be employed.

These two structures for making the oxide semiconductor film 502 have a stacked-layer structure of a plurality of layers can be combined as appropriate.

In the case where the oxide semiconductor film 502 has a stacked-layer structure of a plurality of layers, oxygen may be added each time the oxide semiconductor film is formed. For addition of oxygen, heat treatment in an oxygen atmosphere, an ion implantation method, an ion doping method, a plasma immersion ion implantation method, plasma treatment performed in an atmosphere containing oxygen, or the like can be employed.

Oxygen is added each time the oxide semiconductor film is formed, whereby an effect of reducing oxygen vacancies in the oxide semiconductor can be improved.

Next, in a photolithography process, a resist mask is formed over the oxide semiconductor film and selective etching is performed thereon, so that an island-shaped oxide semiconductor film 503 is formed. After the island-shaped oxide semiconductor film 503 is formed, the resist mask is removed.

A resist mask used for forming the island-shaped oxide semiconductor film 503 may be formed by an inkjet method. Formation of the resist mask by an inkjet method needs no photomask; thus, manufacturing cost can be reduced.

The etching of the oxide semiconductor film 502 may be wet etching, dry etching, or both of them. As an etchant used for wet etching of the oxide semiconductor film 502, for example, a solution obtained by mixture of phosphoric acid, acetic acid, and nitric acid, or the like can be used. Further, ITO-07N (produced by KANTO CHEMICAL CO., INC.) may be used. Further, the oxide semiconductor film may also be etched by dry etching using an inductively coupled plasma (ICP) etching method.

Further, heat treatment may be performed on the oxide semiconductor film 503 in order to remove excess hydrogen (including water or a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like.

Further, in the case where a crystalline oxide semiconductor film is used as the oxide semiconductor film 503, heat treatment for crystallization may be performed thereon.

In this embodiment, the substrate is put into an electric furnace that is one of heat treatment apparatuses, and the oxide semiconductor film 503 is subjected to heat treatment at 450° C. in a nitrogen atmosphere for one hour and further to heat treatment at 450° C. in an atmosphere containing nitrogen and oxygen for one hour.

The heat treatment apparatus is not limited to an electric furnace; any device for heating an object by heat conduction or heat radiation from a heating element such as a resistance heating element may be used. For example, a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the high-temperature gas, an inert gas which does not react with an object to be processed by heat treatment, such as nitrogen or a rare gas such as argon, is used.

For example, as the heat treatment, GRTA may be performed as follows: the substrate is put in an inert gas heated at a high temperature of 650° C. to 700° C., heated for several minutes, and taken out of the inert gas.

In the heat treatment, it is preferable that moisture, hydrogen, and the like be not contained in nitrogen or the rare gas such as helium, neon, or argon. The purity of nitrogen or the rare gas such as helium, neon, or argon which is introduced into the heat treatment apparatus is set to preferably 6N (99.9999%) or higher, more preferably 7N (99.99999%) or higher (that is, the impurity concentration is preferably 1 ppm or lower, more preferably 0.1 ppm or lower).

In addition, after the oxide semiconductor film 503 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb according to the measurement with a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, more preferably 7N or higher (i.e., the impurity concentration in the oxygen gas or the dinitrogen monoxide gas is preferably 1 ppm or less, more preferably 0.1 ppm or less). The oxygen gas or the dinitrogen monoxide gas acts to supply oxygen that is a main constituent material of the oxide semiconductor and which is reduced by the step for removing impurities for dehydration or dehydrogenation, so that oxygen vacancies in the oxide semiconductor film 503 can be reduced.

The timing of the heat treatment for dehydration or dehydrogenation may be either after the formation of the oxide semiconductor film 502 or after the formation of the island-shaped oxide semiconductor film 503.

The heat treatment for dehydration or dehydrogenation may be performed plural times and may also serve as another heat treatment.

When the heat treatment for dehydration or dehydrogenation is performed in the state where the insulating film 499 is covered with the film-shaped oxide semiconductor film 502 which has not been processed into the island-shaped oxide semiconductor film 503, oxygen contained in the insulating film 499 can be prevented from being released to the outside by the heat treatment.

Further, after the heat treatment for dehydration or dehydrogenation, a step for introducing oxygen into the oxide semiconductor film may be performed. By introducing oxygen into the oxide semiconductor film, oxygen released from the oxide semiconductor film by the heat treatment can be repaired, whereby oxygen vacancies in the oxide semiconductor film can be reduced.

As for the step for oxygen introduction, oxygen is introduced into the oxide semiconductor film 503 either directly or through another film such as a gate insulating film. In the case where oxygen is introduced thereinto through another film, an ion implantation method, an ion doping method, a plasma immersion ion implantation method, or the like may be used. In the case where oxygen is introduced directly into the oxide semiconductor film which is exposed, plasma treatment or the like can be used.

Next, an insulating film 504 which is to be a gate insulating film is formed over the insulating film 499 and the oxide semiconductor film 503.

To improve the coverage with the insulating film 504, planarizing treatment may be performed on a surface of the oxide semiconductor film 503. The planarity of the surface of the oxide semiconductor film 503 is preferably good particularly in the case where a thin insulating film is used as the insulating film 504.

The insulating film 504 has a thickness greater than or equal to 1 nm and less than or equal to 20 nm and can be formed by a sputtering method, an MBE method, a plasma-enhanced CVD method, a pulse laser deposition method, an ALD method, or the like as appropriate. The insulating film 504 may also be formed with a sputtering apparatus which performs film deposition with surfaces of a plurality of substrates set substantially perpendicular to a surface of a sputtering target.

The insulating film 504 can be formed using silicon oxide, gallium oxide, aluminum oxide, silicon nitride, silicon oxynitride, aluminum oxynitride, or silicon nitride oxide. With the use of a high-k material such as hafnium oxide, yttrium oxide, hafnium silicate ($HfSi_xO_y$ ($x>0$, $y>0$)), hafnium silicate to which nitrogen is added ($HfSi_xO_y$ ($x>0$, $y>0$)), hafnium aluminate ($HfAl_xO_y$ ($x>0$, $y>0$)), or lanthanum oxide as a material for the insulating film 504, the gate leakage current can be reduced. The insulating film 504 can be formed of a single-layer structure or a stacked-layered structure using any of the above-described materials.

In this embodiment, a 20-nm-thick silicon oxynitride film is formed by a plasma-enhanced CVD method.

Next, a conductive film which is to be a gate electrode (including a wiring formed of the same layer as the gate electrode) is formed over the insulating film 504, and then, an insulating film is formed thereover. After that, in a photolithography process, a resist mask is formed over the insulating film and selective etching is performed thereon, so that a stack of a gate electrode 505 and an insulating film 506 is formed (see FIG. 11B).

The gate electrode 505 can be formed using a metal material such as molybdenum, titanium, tantalum, tungsten, aluminum, copper, chromium, neodymium, or scandium or an alloy material which contains any of these materials as a main component. Alternatively, a semiconductor film typified by a polycrystalline silicon film doped with an impurity element such as phosphorus, or a silicide film of nickel silicide or the like may be used as the gate electrode 505. The gate electrode 505 is formed of either a single-layer structure or a stacked-layer structure.

As a material for the gate electrode 505, a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added can also be used. It is also possible to use a stacked-layer structure of the above-described conductive material and the above-described metal material.

As the gate electrode 505 which is in contact with the insulating film 504, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function higher than or equal to 5 eV (electron volts), preferably higher than or equal to 5.5 eV (electron volts); thus, when used as the gate electrode, the threshold voltage of the transistor can be positive. Accordingly, a so-called normally-off switching element can be achieved.

As the insulating film 506, an inorganic insulating material such as silicon oxide, silicon oxynitride, aluminum oxide, aluminum oxynitride, silicon nitride, aluminum nitride, silicon nitride oxide, or aluminum nitride oxide can be used. The insulating film 506 can be formed by a plasma-enhanced CVD method, a sputtering method, or the like.

Next, a dopant is added into the oxide semiconductor film 503 through the insulating film 504 with the gate electrode 505 and the insulating film 506 as masks, so that regions 507a and 507b each of which contains the dopant are formed.

An element by which the conductivity of the oxide semiconductor film 503 is changed is used as the dopant. One or more selected from the following can be used as the dopant: Group 15 elements (e.g., nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

The dopant can be added into the oxide semiconductor film 503 through another film (in this embodiment, the insulating film 504) depending on its addition method. Examples of the method for adding the dopant are an ion implantation method, an ion doping method, and a plasma immersion ion implantation method. In that case, it is preferable to use a single ion of the dopant, or a fluoride ion, or a chloride ion of the dopant.

The introduction of the dopant may be controlled by setting the implantation conditions such as the accelerated voltage and the dosage, or the thickness of the films through which the dopant passes, as appropriate. In this embodiment, phosphorus is used as the dopant, and phosphorus ions are implanted by an ion implantation method. The dosage of the dopant can be set to be greater than or equal to $1\times10^{13}$ ions/cm$^2$ and less than or equal to $5\times10^{16}$ ions/cm$^2$.

By adding the dopant to the oxide semiconductor film 503, the concentration of the dopant in the region 507a, 507b which contains the dopant is preferably greater than or equal to $5\times10^{18}$/cm$^3$ and less than or equal to $1\times10^{22}$/cm$^3$.

The dopant may be added to the oxide semiconductor film 503 while the substrate is heated. Further, the introduction of the dopant into the oxide semiconductor film 503 may be performed plural times, and plural kinds of dopants may be used.

Further, heat treatment may be performed thereon after the dopant is added. The heat treatment is preferably performed at a temperature higher than or equal to 300° C. and lower than or equal to 700° C., more preferably higher than or equal to 300° C. and lower than or equal to 450° C. for one hour under an oxygen atmosphere. The heat treatment may also be performed under a nitrogen atmosphere, reduced pressure, or the air (ultra-dry air).

In this embodiment, phosphorus (P) ions are implanted into the oxide semiconductor film 503 by an ion implantation method. The conditions of the phosphorus (P) ion implantation are as follows: the acceleration voltage is 25 kV and the dosage is $1.0\times10^{15}$ ions/cm$^2$.

In the case where the oxide semiconductor film 503 is a CAAC-OS film, the oxide semiconductor film 503 is partly amorphized by the addition of the dopant in some cases. In that case, the crystallinity of the oxide semiconductor film 503 can be recovered by performing heat treatment thereon after the introduction of the dopant.

As a result of the introduction of the dopant, the oxide semiconductor film 503 in which the regions 507a and 507b containing the dopant between which a channel formation region 508 is interposed is formed.

Next, an insulating film is formed over the gate electrode 505 and the insulating film 506 and then anisotropically etched, whereby the sidewall insulating films 509a and 509b are formed. Moreover, the insulating film 504 is etched using the gate electrode 505, the sidewall insulating film 509a, and the sidewall insulating film 509b as masks, so that a gate insulating film 511 is formed (see FIG. 11C).

The sidewall insulating films 509a and 509b can be formed using a material and a method similar to those of the insulating film 506. In this embodiment, a silicon oxynitride film formed by a CVD method is used for the sidewall insulating films 509a and 509b.

Next, a conductive film which is to be a source electrode and a drain electrode (including a wiring formed of the same layer as the source electrode and the drain electrode) is formed to cover the oxide semiconductor film 503, the gate insulating film 511, the sidewall insulating films 509a and 509b, and the insulating film 506.

The conductive film which is to be the source electrode and the drain electrode can be formed, for example, using a metal film containing an element selected from aluminum (Al), chromium (Cr), copper (Cu), tantalum (Ta), titanium (Ti), molybdenum (Mo), and tungsten (W), a metal nitride film (a titanium nitride film, a molybdenum nitride film, or a tungsten nitride film) containing any of the above elements as a component, or the like. A high-melting-point metal film of titanium, molybdenum, tungsten, or the like or a metal nitride film of any of these elements (e.g., a titanium nitride film, a molybdenum nitride film, or a tungsten nitride film) may be stacked on at least one of a lower side and an upper side of the metal film of aluminum, copper, or the like.

A conductive metal oxide film may also be used as the conductive film which is to be the source and drain electrodes. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials to which silicon oxide is added can be used. It is possible to use a stacked-layer structure of the above-described conductive material and the above-described metal oxide material.

Next, in a photolithography process, a resist mask is formed over the conductive film, and selective etching is performed on the conductive film, whereby the source electrode and the drain electrode are processed in the direction of the channel width W.

Next, over the conductive film, an insulating film 515 and an insulating film 517 are formed.

The insulating film 515 and the insulating film 517 are formed as appropriate by a method such as a sputtering method, which prevents entry of impurities such as hydrogen.

As each of the insulating film 515 and the insulating film 517, an inorganic insulating film, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film can be used.

As the insulating film 515, an inorganic insulating film having a high density may be provided in contact with a source electrode 516a and a drain electrode 516b. For example, an aluminum oxide film is formed over the source electrode 516a and the drain electrode 516b by a sputtering method. When the aluminum oxide film has a high density (the film density is higher than or equal to 3.2 g/cm$^3$, preferably higher than or equal to 3.6 g/cm$^3$), the transistor 510 can have stable electric characteristics. The film density can be measured by Rutherford backscattering spectrometry (RBS) or X-ray reflection (XRR).

An aluminum oxide film which can be used as an inorganic insulating film provided over the transistor 510 has a high shielding effect (blocking effect) of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change in the electric characteristics of the transistor, into the oxide semiconductor film 503 and release of oxygen, which is a main constituent material of the oxide semiconductor, from the oxide semiconductor film 503.

Next, polishing treatment is performed on the insulating film 515, the insulating film 517, and the conductive film to expose the insulating film 506. Accordingly, the insulating film 515, the insulating film 517, and the conductive film are partly removed, so that the source electrode 516a and the drain electrode 516b are formed.

As the polishing treatment, a chemical mechanical polishing (CMP) method can be used, but another cutting (grinding or polishing) method may be alternatively used. Further, the planarity of the polished surface can be improved by performing a dry etching method, plasma treatment (reverse plasma treatment), or the like after the polishing treatment.

In this embodiment, since the insulating film 506 is provided over the gate electrode 505, even when the polishing treatment is performed on the insulating film 515, the insulating film 517, and the conductive film, a short circuit between the gate electrode 505 and any of the source electrode 516a and the drain electrode 516b can be suppressed.

Figure 12A:
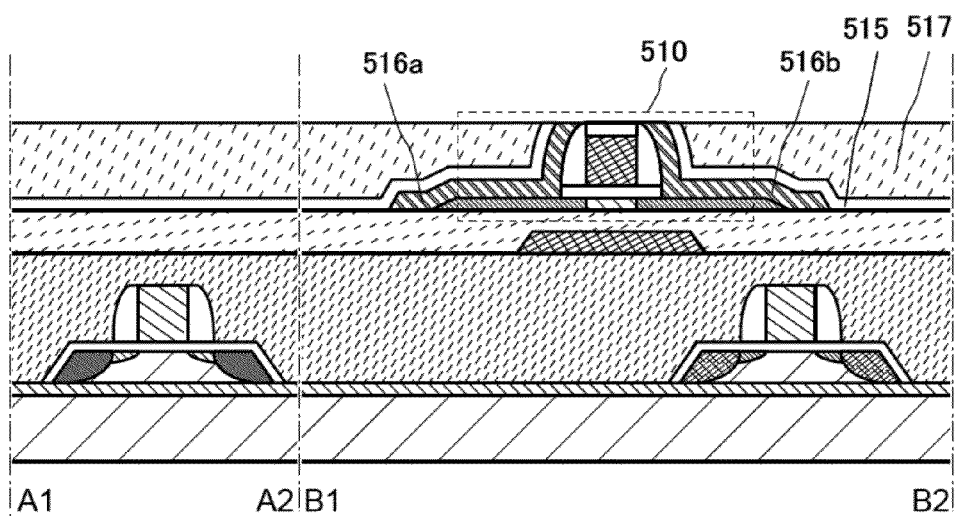
FIGS. 12A and 12B are diagrams illustrating an example of the manufacturing process of the latch circuit.
Figure 12B:
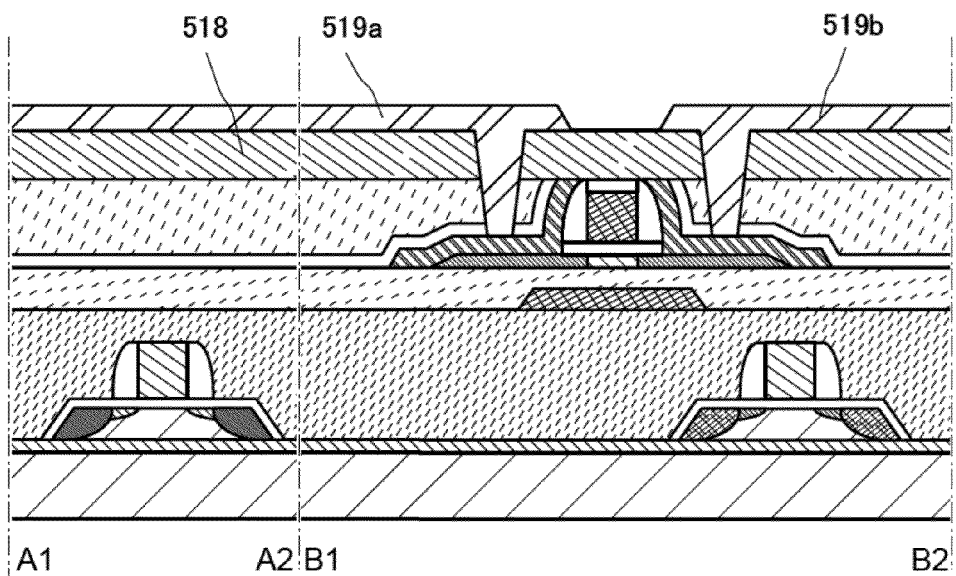
Figure 13:
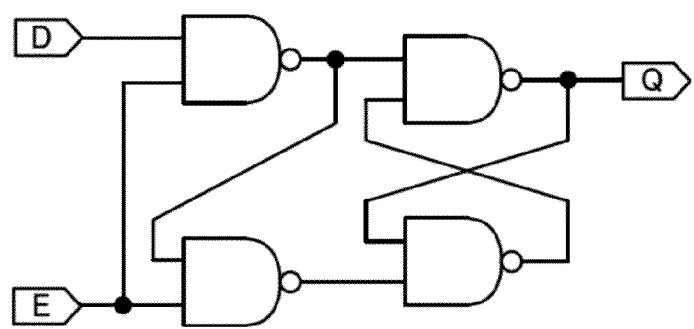
FIG. 13 is a diagram illustrating a conventional latch circuit.

Through the above process, the transistor 510 according to one embodiment of the present invention is formed (see FIG. 12A).

Next, an insulating film 518 is formed to cover the transistor 510. The insulating film 518 can be formed using a material and a method which are the same as those of any of the insulating films 515 and 517, and thus description thereof is skipped.

Next, wirings 519a and 519b are formed over the insulating film 518. The wirings 519a and 519b are provided to connect the transistor 510 and another transistor. The wiring 519a is electrically connected to the source electrode 516a through an opening provided in the insulating film 518, the insulating film 515, and the insulating film 517. Further, the wiring 519b is electrically connected to the drain electrode 516b through an opening provided in the insulating film 518, the insulating film 515, and the insulating film 517.

The wirings 519a and 519b can be formed using a similar material and a similar method to the gate electrode 505, and thus detailed description thereof is skipped.

For example, as the wirings 519a and 519b, a single layer of a molybdenum film, a stacked layer of a tantalum nitride film and a copper film, a stacked layer of a tantalum nitride film and a tungsten film, or the like can be used.

Through the above-described process, the latch circuit according to one embodiment of the present invention can be formed.

In accordance with the manufacturing method described in this embodiment, the transistor using a semiconductor film of an oxide semiconductor or the like can be formed to be stacked over the transistor using a single crystalline semiconductor film of silicon or the like. Accordingly, the transistors constituting the latch circuit can partly have a stack structure, leading to a reduction in the area of the latch circuit.

Further, in accordance with the manufacturing method described in this embodiment, impurities such as hydrogen in the oxide semiconductor film are sufficiently reduced, or sufficient oxygen is supplied to make the oxide semiconductor film an oxygen-excess state, whereby high purification can be achieved. Specifically, the concentration of hydrogen in the oxide semiconductor film is $5\times10^{19}$ atoms/cm$^3$ or less, preferably $5\times10^{18}$ atoms/cm$^3$ or less, more preferably $5\times10^{17}$ atoms/cm$^3$ or less. The concentration of hydrogen in the oxide semiconductor film is measured by secondary ion mass spectrometry (SIMS). Further, by sufficiently supplying oxygen into the oxide semiconductor film to reduce oxygen vacancies, an increase in majority carriers is suppressed. Accordingly, a change of the threshold voltage of the transistor due to an increase in majority carriers can be suppressed, so that the reliability of the transistor can be improved.

Accordingly, majority carriers (electrons) of the oxide semiconductor film 503 flow only from the source of the transistor. Further, the channel formation region can be depleted completely, enabling an off-state current of the transistor to be extremely small. The off-state current of the transistor using the oxide semiconductor film 503 is extremely small: 10 yA/μm or less at room temperature, and 1 yA/μm or less at 85° C. to 95° C.

Accordingly, the S factor of the transistor using the oxide semiconductor film 503 is reduced to be an ideal value. Further, the transistor has high reliability.

The structures, methods, and the like described in this embodiment can be combined with structures, methods, and the like described in the other embodiments, as appropriate.

This application is based on Japanese Patent Application serial no. 2012-048118 filed with Japan Patent Office on Mar. 5, 2012, the entire contents of which are hereby incorporated by reference.

What is claimed is:

1. A latch circuit comprising:
a first inverter and a second inverter, each comprising an input terminal and an output terminal;
a diode comprising an anode and a cathode;
a switch comprising a first terminal and a second terminal;
a transistor comprising a source terminal and a drain terminal; and
a capacitor,
wherein the switch is electrically connected in parallel to the diode, wherein the output terminal of the first inverter is electrically connected to the input terminal of the second inverter through the diode and the switch, wherein the output terminal of the second inverter is electrically connected to the input terminal of the first inverter, and wherein one of the source terminal and the drain terminal of the transistor is electrically connected to the cathode of the diode, to the switch and to the input terminal of the second inverter.

2. The latch circuit according to claim 1, wherein the transistor comprises a channel formation region in an oxide semiconductor layer.

3. The latch circuit according to claim 1, wherein the switch is a transmission gate.

4. The latch circuit according to claim 1, wherein the latch circuit is configured to hold a logic state at the other of the source terminal and the drain terminal of the transistor.

5. The latch circuit according to claim 1,
wherein the first inverter comprises an inverter transistor comprising a channel formation region in a layer of a first semiconductor material,
wherein a channel formation region of the transistor is in a layer of a second semiconductor material, and
wherein the first semiconductor material and the second semiconductor material are different.

6. The latch circuit according to claim 1,
wherein the first inverter comprises an inverter transistor comprising a channel formation region in a layer of single crystal silicon,
wherein a channel formation region of the transistor is in a layer of an oxide semiconductor material formed over an insulating layer covering the inverter transistor.

7. The latch circuit according to claim 1, wherein a channel formation region of the transistor is in a layer of a material having a band gap greater than or equal to 2 eV.

8. The latch circuit according to claim 1, wherein the transistor has an off-state current per channel formation region width lower than or equal to $1 \times 10^{-19}$ A/μm.

9. A latch circuit comprising:
a first switch;
a first inverter comprising an input terminal electrically connected to a terminal of the first switch;
a diode comprising an anode and a cathode, the anode being electrically connected to an output terminal of the first inverter at a node (A);
a first transistor comprising a source terminal and a drain terminal, one of the source terminal and the drain terminal being electrically connected to the cathode of the diode at a node (B);
a capacitor electrically connected to the other of the source terminal and the drain terminal of the first transistor;
a second switch electrically connected in parallel with the diode between the node (A) and the node (B);
a second transistor comprising a source terminal and a drain terminal, one of the source terminal and the drain terminal being electrically connected to the node (B);
a second inverter comprising an input electrically connected to the node (B); and
a third switch electrically connecting an output of the second inverter to the terminal of the first switch and to the input of the first inverter.

10. The latch circuit according to claim 9, wherein the second switch is a transmission gate.

11. The latch circuit according to claim 9, wherein the latch circuit is configured to hold a logic state at a node formed by the other of the source terminal and the drain terminal of the first transistor and the capacitor.

12. The latch circuit according to claim 9,
wherein a channel formation region of the first transistor is formed in a layer of a first semiconductor material,
wherein a channel formation region of the second transistor is formed in a layer of a second semiconductor material, and
wherein the first semiconductor material and the second semiconductor material are different.

13. The latch circuit according to claim 9,
wherein a channel formation region of the second transistor is formed in a layer of single crystal silicon, and
wherein a channel formation region of the first transistor is formed in a layer of an oxide semiconductor material formed over an insulating layer covering the second transistor.

14. The latch circuit according to claim 9, wherein a channel formation region of the first transistor is in a layer of a material having a band gap greater than or equal to 2 eV.

15. The latch circuit according to claim 9, wherein the first transistor has an off-state current per channel formation region width lower than or equal to $1 \times 10^{-19}$ A/μm.

16. A latch circuit comprising:
a first switch;
a first inverter comprising an input terminal electrically connected to a terminal of the first switch;
a diode comprising an anode and a cathode, the anode being electrically connected to an output terminal of the first inverter at a node (A);
a first transistor comprising a source terminal and a drain terminal, one of the source terminal and the drain terminal being electrically connected to the cathode of the diode at a node (B);
a capacitor electrically connected to the other of the source terminal and the drain terminal of the first transistor;
a second switch electrically connected in parallel with the diode between the node (A) and the node (B);
a second transistor comprising a source terminal and a drain terminal, one of the source terminal and the drain terminal being electrically connected to the node (B);
a second inverter comprising an input electrically connected to the node (B); and
a third switch electrically connecting an output of the second inverter to the terminal of the first switch and to the input of the first inverter,
wherein the first transistor comprises a channel formation region in an oxide semiconductor layer.

17. The latch circuit according to claim 16, wherein the second switch is a transmission gate.

18. The latch circuit according to claim 16, wherein the latch circuit is configured to hold a logic state at a node formed by the other of the source terminal and the drain terminal of the first transistor and the capacitor.

19. The latch circuit according to claim 16,
wherein a channel formation region of the first transistor is formed in a layer of a first semiconductor material,
wherein a channel formation region of the second transistor is formed in a layer of a second semiconductor material, and
wherein the first semiconductor material and the second semiconductor material are different.

20. The latch circuit according to claim 16,
wherein the oxide semiconductor layer of the first transistor is formed over an insulating layer covering the second transistor, and wherein the oxide semiconductor layer of the first transistor is formed in a semiconductor material different from a semiconductor material in which the channel formation region of the second transistor is formed.

21. The latch circuit according to claim 16, wherein the oxide semiconductor layer is formed from a material having a band gap greater than or equal to 2 eV.

22. The latch circuit according to claim 16, wherein the first transistor has an off-state current per channel formation region width lower than or equal to $1 \times 10^{-19}$ A/μm.

* * * * *